(12) United States Patent
Seo et al.

(10) Patent No.: US 9,076,976 B2
(45) Date of Patent: *Jul. 7, 2015

(54) LIGHT-EMITTING ELEMENT, LIGHT-EMITTING DEVICE, ELECTRONIC APPLIANCE, AND LIGHTING DEVICE

(71) Applicant: Semiconductor Energy Laboratory Co., Ltd., Kanagawa-ken (JP)

(72) Inventors: Hiromi Seo, Kanagawa (JP); Satoshi Seo, Kanagawa (JP); Satoko Shitagaki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/864,407

(22) Filed: Apr. 17, 2013

(65) Prior Publication Data

US 2013/0277655 A1  Oct. 24, 2013

(30) Foreign Application Priority Data

Apr. 20, 2012 (JP) ................................. 2012-096887

(51) Int. Cl.
*H01L 51/50* (2006.01)

(52) U.S. Cl.
CPC ....... *H01L 51/5016* (2013.01); *H01L 2251/552* (2013.01); *H01L 51/5004* (2013.01); *H01L 51/5056* (2013.01); *H01L 2251/5384* (2013.01)

(58) Field of Classification Search
CPC ............ H01L 51/0072; H01L 51/5016; H01L 2251/552
USPC ........................................... 257/40, E51.018

See application file for complete search history.

(56) References Cited

U.S. PATENT DOCUMENTS

| 7,572,522 | B2 | 8/2009 | Seo et al. |
| 7,906,226 | B2 | 3/2011 | Matsuura et al. |
| 7,943,925 | B2 | 5/2011 | Yamazaki |

(Continued)

FOREIGN PATENT DOCUMENTS

| CN | 102668149 A | 9/2012 |
| JP | 2010-182699 | 8/2010 |

(Continued)

OTHER PUBLICATIONS

U.S. Appl. No. 13/864,425.*

(Continued)

*Primary Examiner* — John C Ingham
(74) *Attorney, Agent, or Firm* — Husch Blackwell LLP

(57) ABSTRACT

A light-emitting element which has low driving voltage and high emission efficiency is provided. The light-emitting element includes, between a pair of electrodes, a hole-transport layer and a light-emitting layer over the hole-transport layer. The light-emitting layer contains a first organic compound having an electron-transport property, a second organic compound having a hole-transport property, and a light-emitting third organic compound converting triplet excitation energy into light emission. A combination of the first organic compound and the second organic compound forms an exciplex. The hole-transport layer contains at least a fourth organic compound whose HOMO level is lower than or equal to that of the second organic compound and a fifth organic compound whose HOMO level is higher than that of the second organic compound.

14 Claims, 19 Drawing Sheets

(56) References Cited

U.S. PATENT DOCUMENTS

| | | | |
|---|---|---|---|
| 8,105,701 | B2 | 1/2012 | Matsuura et al. |
| 8,173,998 | B2* | 5/2012 | Choong et al. ............ 257/40 |
| 8,247,804 | B2* | 8/2012 | Seo et al. ............ 257/40 |
| 8,294,361 | B2* | 10/2012 | Masui et al. ............ 313/504 |
| 2006/0134464 | A1 | 6/2006 | Nariyuki |
| 2009/0102368 | A1* | 4/2009 | Shitagaki et al. ............ 313/504 |
| 2011/0001146 | A1 | 1/2011 | Yamazaki et al. |
| 2011/0127510 | A1* | 6/2011 | Seo et al. ............ 257/40 |
| 2012/0153267 | A1 | 6/2012 | Matsuura et al. |
| 2012/0205632 | A1 | 8/2012 | Shitagaki et al. |
| 2012/0205687 | A1 | 8/2012 | Yamazaki et al. |
| 2012/0206035 | A1 | 8/2012 | Shitagaki et al. |
| 2012/0217486 | A1 | 8/2012 | Takemura et al. |
| 2012/0217487 | A1 | 8/2012 | Yamazaki et al. |
| 2012/0242219 | A1 | 9/2012 | Seo et al. |
| 2012/0248421 | A1 | 10/2012 | Yamazaki et al. |
| 2012/0256535 | A1 | 10/2012 | Seo et al. |
| 2012/0267618 | A1 | 10/2012 | Monkman et al. |
| 2013/0240851 | A1 | 9/2013 | Seo et al. |
| 2013/0270531 | A1 | 10/2013 | Seo et al. |
| 2013/0292656 | A1 | 11/2013 | Seo et al. |
| 2013/0306945 | A1 | 11/2013 | Seo |
| 2014/0034926 | A1 | 2/2014 | Matsubara et al. |
| 2014/0034927 | A1 | 2/2014 | Seo et al. |
| 2014/0034930 | A1 | 2/2014 | Seo et al. |
| 2014/0034932 | A1 | 2/2014 | Seo et al. |
| 2014/0061604 | A1 | 3/2014 | Seo et al. |
| 2014/0191220 | A1 | 7/2014 | Watabe et al. |

FOREIGN PATENT DOCUMENTS

| | | |
|---|---|---|
| JP | 2011-77494 | 4/2011 |
| JP | 2013-509670 | 3/2013 |
| KR | 10-2012-0103571 | 9/2012 |
| WO | WO 00/70655 A2 | 11/2000 |
| WO | WO 2011/027749 A1 | 3/2011 |
| WO | WO 2011/042443 A1 | 4/2011 |

OTHER PUBLICATIONS

Kondakova, M.E. et al., "High-Efficiency, Low-Voltage Phosphorescent Organic Light-Emitting Diode Devices with Mixed Host," Journal of Applied Physics, vol. 104, 2008, pp. 094501-1-094501-17.

Park, Y.-S. et al., "Exciplex-Forming Co-Host for Organic Light-Emitting Diodes with Ultimate Efficiency," Advanced Functional Materials, May 6, 2013, pp. 1-7.

International Search Report re Application No. PCT/JP2013/061135, Dated Jul. 16, 2013.

Written Opinion re Application No. PCT/JP2013/061135, Dated Jul. 16, 2013.

Itano, K. et al, "Exciplex Formation at the Organic Solid-State Interface: Yellow Emission in Organic Light-Emitting Diodes Using Green-Fluorescent tris(8-quinolinolato)aluminum and Hole-Transporting Molecular Materials with Low Ionization Potentials," Applied Physics Letters, vol. 72, No. 6, Feb. 9, 1998, pp. 636-638.

Baldo, M.A. et al, "Very High-Efficiency Green Organic Light-Emitting Devices Based on Electrophosphorescence," Applied Physics Letters, vol. 75, No. 1, Jul. 5, 1999, pp. 4-6.

Choong, V.-E. et al, "Organic Light-Emitting Diodes With a Bipolar Transport Layer," Applied Physics Letters, vol. 75, No. 2, Jul. 12, 1999, pp. 172-174.

* cited by examiner

— — Fluorescence spectrum of first organic compound 120
    (or second organic compound 122)
— - — Phosphorescence spectrum of first organic compound 120
    (or second organic compound 122)
——— Absorption spectrum of third organic compound 124
——— Emission spectrum of the exciplex

US 9,076,976 B2

LIGHT-EMITTING ELEMENT, LIGHT-EMITTING DEVICE, ELECTRONIC APPLIANCE, AND LIGHTING DEVICE

TECHNICAL FIELD

One embodiment of the present invention relates to a light-emitting element in which an organic compound capable of emitting light by application of an electric field is provided between a pair of electrodes, and also relates to a light-emitting device, an electronic appliance, and a lighting device including such a light-emitting element.

BACKGROUND ART

Light-emitting elements including an organic compound as a luminous body, which have features such as thinness, lightness, high-speed response, and DC driving at low voltage, are expected to be applied to next-generation flat panel displays. In particular, display devices in which light-emitting elements are arranged in a matrix are considered to have advantages of a wide viewing angle and high visibility over conventional liquid crystal display devices.

A light-emitting element is said to have the following light emission mechanism: when voltage is applied between a pair of electrodes with a light-emitting layer including a luminous body provided therebetween, electrons injected from the cathode and holes injected from the anode are recombined in an light emission center of the light-emitting layer to form molecular excitons, and energy is released and light is emitted when the molecular excitons relax to the ground state. A singlet excited state and a triplet excited state are known as excited states, and light emission can probably be obtained through either state. Light emission from the singlet excited state (S*) is called fluorescence, and light emission from the triplet excited state (T*) is called phosphorescence.

In order to improve element characteristics of such light-emitting elements, improvement of an element structure, development of a material, and the like have been actively carried out (see, for example, Patent Document 1).

REFERENCE

[Patent Document 1] Japanese Published Patent Application No. 2010-182699

DISCLOSURE OF INVENTION

As disclosed in Patent Document 1, an improved element structure or the like has been developed; however, light-emitting elements still need to be improved in terms of emission efficiency, reliability, and emission characteristics, and light-emitting elements with better characteristics are expected to be developed.

In view of the above, an object of one embodiment of the present invention is to provide a light-emitting element which is driven at low voltage and has high emission efficiency.

One embodiment of the present invention is a light-emitting element which includes, between a pair of electrodes, a hole-transport layer and a light-emitting layer over the hole-transport layer. The light-emitting layer contains a first organic compound having an electron-transport property, a second organic compound having a hole-transport property, and a light-emitting third organic compound converting triplet excitation energy into light emission. A combination of the first organic compound and the second organic compound forms an exciplex. The hole-transport layer contains at least a fourth organic compound whose HOMO level is lower than or equal to that of the second organic compound and a fifth organic compound whose HOMO level is higher than that of the second organic compound.

One embodiment of the present invention is a light-emitting element which includes, between a pair of electrodes, a hole-injection layer, a hole-transport layer over the hole-injection layer, a light-emitting layer over the hole-transport layer, an electron-transport layer over the light-emitting layer, and an electron-injection layer over the electron-transport layer. The light-emitting layer contains a first organic compound having an electron-transport property, a second organic compound having a hole-transport property, and a light-emitting third organic compound converting triplet excitation energy into light emission. A combination of the first organic compound and the second organic compound forms an exciplex. The hole-transport layer contains at least a fourth organic compound whose HOMO level is lower than or equal to that of the second organic compound and a fifth organic compound whose HOMO level is higher than that of the second organic compound.

Note that it is preferable that, in each of the above-described structures, the first organic compound be used as a host material, the second organic compound be used as an assist material, and the third organic compound be used as a guest material. In other words, the mass fraction (or volume fraction) of the third organic compound in the light-emitting layer is preferably lower than the mass fraction of each of the first organic compound and the second organic compound.

Further, in each of the above-described structures, an emission wavelength of an exciplex formed from the first organic compound (host material) and the second organic compound (assist material) is longer than an emission wavelength (fluorescence wavelength) of each of the first organic compound (host material) and the second organic compound (assist material); thus, a fluorescence spectrum of the first organic compound (host material) and a fluorescence spectrum of the second organic compound (assist material) can be converted into an emission spectrum located on the longer wavelength side.

Thus, when an exciplex is fanned in the light-emitting layer in the light-emitting element of one embodiment of the present invention, energy transfer utilizing an overlap between an absorption spectrum of the third organic compound (guest material) and an emission spectrum of the exciplex which is located on the longer wavelength side than an emission wavelength (fluorescence wavelength) of each of the first organic compound (host material) and the second organic compound (assist material) can be performed, which makes the energy transfer efficiency high, so that the light-emitting element can have high emission efficiency.

Further, the hole-transport layer contains at least the fourth organic compound whose HOMO level is lower than or equal to that of the second organic compound (assist material) and the fifth organic compound whose HOMO level is higher than that of the second organic compound (assist material). The fourth organic compound of the hole-transport layer has a function of injecting holes into the light-emitting layer (mainly the second organic compound (assist material) in the light-emitting layer) to facilitate the entry of the holes into the light-emitting layer, which results in an increase in emission efficiency. Since the HOMO level of the fifth organic compound in the hole-transport layer is higher than that of the second organic compound (assist material), driving voltage (simply, voltage), particularly turn-on voltage, can be reduced. These effects can be obtained only when the hole-transport layer contains the two or more kinds of organic compounds and the above-described relation of the HOMO levels exists.

Further, it is preferable that, in each of the above-described structures, the lowest triplet excitation energy level ($T_1$ level) of the fourth organic compound be higher than those of the first organic compound and the second organic compound. Such a structure makes it possible to prevent the triplet excitation energy of the light-emitting layer from diffusing to the hole-transport layer, so that emission efficiency of the element can be increased. Note that the mass fraction (or volume fraction) of the fourth organic compound in the hole-transport layer is preferably higher than or equal to 20% (lower than 100%) in order to prevent the diffusion of the triplet excitation energy of the light-emitting layer to the hole-transport layer.

Further, it is preferable that, in each of the above-described structures, the first organic compound (host material) be a π-electron deficient heteroaromatic compound, the second organic compound (assist material) be a π-electron rich heteroaromatic compound or an aromatic amine compound, and the third organic compound (guest material) be a phosphorescent compound.

Further, one embodiment of the present invention includes, in its category, light-emitting devices including light-emitting elements, and electronic appliances and lighting devices including the light-emitting devices. Therefore, the light-emitting device in this specification refers to an image display device, and a light source (e.g., a lighting device). In addition, the light-emitting device includes, in its category, all of a module in which a light-emitting device is connected to a connector such as a flexible printed circuit (FPC), a tape automated bonding (TAB) tape, or a tape carrier package (TCP), a module in which a printed wiring board is provided on the tip of a TAB tape or a TCP, and a module in which an integrated circuit (IC) is directly mounted on a light-emitting element by a chip on glass (COG) method.

When an exciplex is formed in the light-emitting layer in the light-emitting element of one embodiment of the present invention, energy transfer utilizing an overlap between an absorption spectrum of the third organic compound (guest material) and an emission spectrum of the exciplex which is located on the longer wavelength side than an emission wavelength (fluorescence wavelength) of each of the first organic compound (host material) and the second organic compound (assist material) can be performed, which makes the efficiency of energy transfer high, so that the light-emitting element can have high emission efficiency.

BEST MODE FOR CARRYING OUT THE INVENTION

Figure 1:
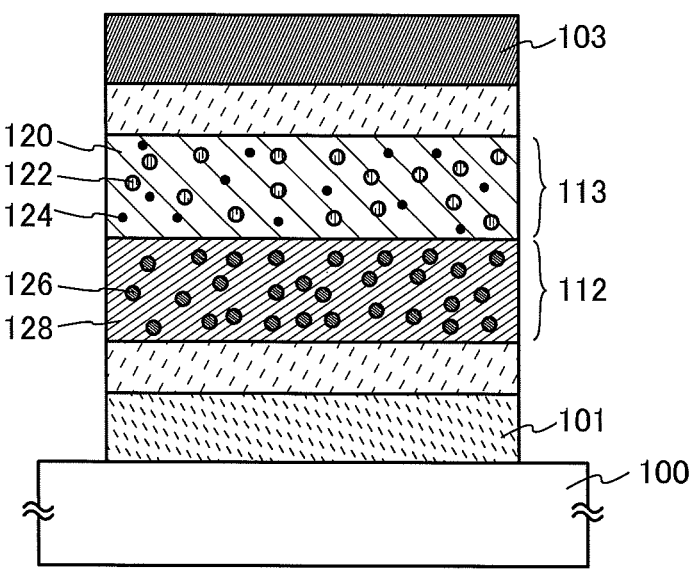
FIG. 1 illustrates a light-emitting element of one embodiment of the present invention.

Hereinafter, embodiments of the present invention will be described in detail with reference to the accompanying drawings. Note that the present invention is not limited to the description below, and modes and details thereof can be modified in various ways without departing from the spirit and the scope of the present invention. Therefore, the invention should not be construed as being limited to the description in the embodiments below.

Note that the position, size, range, or the like of each component illustrated in the drawings and the like is not accurately represented in some cases for easy understanding. Therefore, the disclosed invention is not necessarily limited to the position, size, range, or the like disclosed in the drawings and the like.

In this specification and the like, ordinal numbers such as "first", "second", and "third" are used in order to avoid confusion among components, and do not limit the components numerically.

(Embodiment 1)

In this embodiment, a structural concept of a light-emitting element which is one embodiment of the present invention and a specific structure of the light-emitting element will be described. First, an element structure of the light-emitting element which is one embodiment of the present invention will be described with reference to FIG. 1.

The element structure illustrated in FIG. 1 includes, between a pair of electrodes (a first electrode 101 and a second electrode 103), a hole-transport layer 112 and a light-emitting layer 113 over the hole-transport layer 112. The light-emitting layer 113 contains a first organic compound 120 having an electron-transport property, a second organic compound 122 having a hole-transport property, and a light-emitting third organic compound 124 converting triplet excitation energy into light emission. A combination of the first organic compound 120 and the second organic compound 122 forms an exciplex. The hole-transport layer 112 contains at least a fourth organic compound 126 whose HOMO level is lower than or equal to that of the second organic compound 122 and a fifth organic compound 128 whose HOMO level is higher than that of the second organic compound 122.

Note that in FIG. 1, a hole-injection layer or a hole-transport layer can be formed if needed in a region between the first electrode 101 and the hole-transport layer 112. Further, in FIG. 1, an electron-injection layer or an electron-transport layer can be formed if needed in a region between the second electrode 103 and the light-emitting layer 113.

Note that it is preferable that the first organic compound 120 be used as a host material, the second organic compound 122 be used as an assist material, and the third organic compound 124 be used as a guest material. In other words, the mass fraction (or volume fraction) of the third organic compound in the light-emitting layer is preferably lower than the mass fraction of each of the first organic compound and the second organic compound. In the description below, in some cases, the first organic compound 120, the second organic compound 122, and the third organic compound 124 are referred to as a host material, an assist material, and a guest material, respectively.

An electron-transport material having an electron mobility of, for example, $10^{-6}$ cm$^2$/Vs or higher can be used as the first organic compound 120 (host material). In addition, a hole-transport material having a hole mobility of, for example, $10^{-6}$ cm$^2$/Vs or higher can be used as the second organic compound 122 (assist material).

Note that in the above structure, the lowest triplet excitation energy level ($T_1$ level) of each of the first organic compound 120 (host material) and the second organic compound 122 (assist material) is preferably higher than the $T_1$ level of the third organic compound 124 (guest material). The reason is as follows: when the $T_1$ level of each of the first organic compound 120 (host material) and the second organic compound 122 (assist material) is lower than the $T_1$ level of the third organic compound 124 (guest material), the triplet excitation energy of the third organic compound 124 (guest material), which contributes to light emission, is quenched by the first organic compound 120 (host material) and the second organic compound 122 (assist material), which causes a reduction in emission efficiency.

Further, for improvement in efficiency of energy transfer from a host material to a guest material, Förster mechanism (dipole-dipole interaction) and Dexter mechanism (electron exchange interaction), which are known as mechanisms of energy transfer between molecules, are considered. According to the mechanisms, it is preferable that an emission spectrum of a host material (fluorescence spectrum in energy transfer from a singlet excited state, phosphorescence spectrum in energy transfer from a triplet excited state) largely overlap with an absorption spectrum of a guest material (specifically, spectrum in an absorption band on the longest wavelength (lowest energy) side).

However, in the case of using, for example, a phosphorescent compound as a guest material, it is difficult to obtain an overlap between a fluorescence spectrum of a host material and an absorption spectrum in an absorption band on the longest wavelength (lowest energy) side of the guest material. The reason for this is as follows: if the fluorescence spectrum of the host material overlaps with the absorption spectrum in the absorption band on the longest wavelength (lowest energy) side of the guest material, since a phosphorescence spectrum of the host material is located on a longer wavelength (lower energy) side as compared to the fluorescence spectrum, the $T_1$ level of the host material becomes lower than the $T_1$ level of the phosphorescent compound and the above-described problem of quenching occurs; yet, when the host material is designed in such a manner that the $T_1$ level of the host material is higher than the $T_1$ level of the phosphorescent compound used as the guest material to avoid the problem of quenching, the fluorescence spectrum of the host material is shifted to the shorter wavelength (higher energy) side, and thus the fluorescence spectrum does not have any overlap with the absorption spectrum in the absorption band on the longest wavelength (lowest energy) side of the guest material. For that reason, in general, it is difficult to obtain an overlap between a fluorescence spectrum of a host material and an absorption spectrum in an absorption band on the longest wavelength (lowest energy) side of a guest material so as to maximize energy transfer from a singlet excited state of a host material.

Thus, in one embodiment of the present invention, the combination of the first organic compound 120 and the second organic compound 122 forms an exciplex (also referred to as excited complex). An exciplex will be described below with reference to FIGS. 2A and 2B.

Figure 2A:
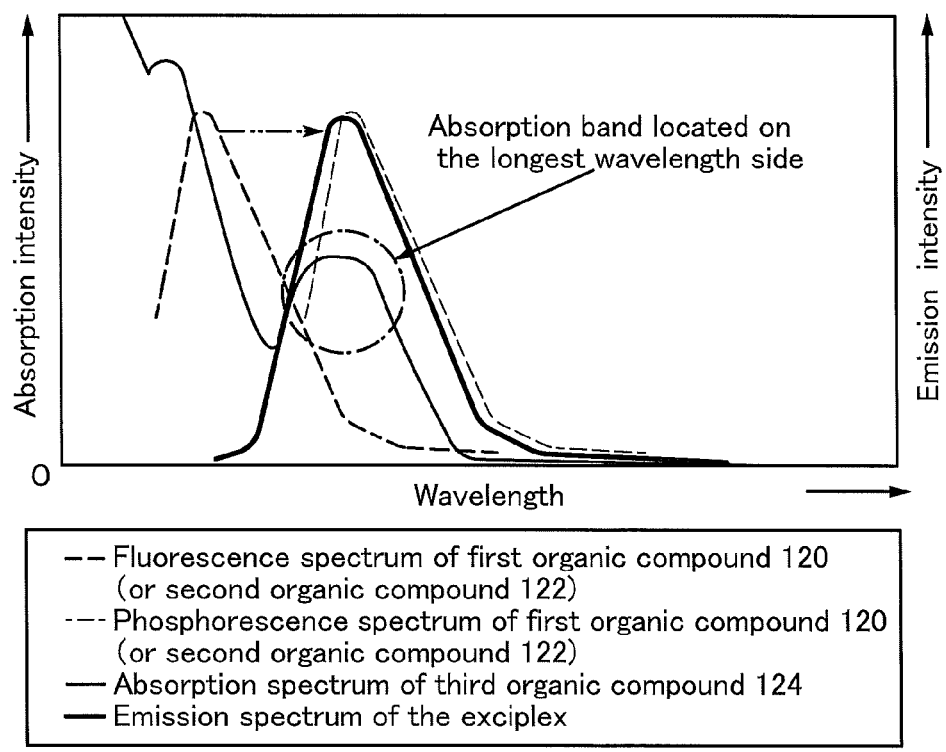
FIGS. 2A and 2B show a concept of one embodiment of the present invention.

FIG. 2A is a schematic view showing the concept of an exciplex; a fluorescence spectrum of the first organic compound 120 (or the second organic compound 122), a phosphorescence spectrum of the first organic compound 120 (or the second organic compound 122), an absorption spectrum of the third organic compound 124, and an emission spectrum of the exciplex are shown.

For example, in the light-emitting layer 113, the fluorescence spectrum of the first organic compound 120 (host material) and the fluorescence spectrum of the second organic compound 122 (assist material) are converted into an emission spectrum of an exciplex which is located on the longer wavelength side. Moreover, selecting the first organic compound 120 (host material) and the second organic compound 122 (assist material) so that the emission spectrum of the exciplex largely overlaps with the absorption spectrum of the third organic compound 124 (guest material) makes it possible to maximize energy transfer from a singlet excited state (see FIG. 2A).

Note that also in the case of a triplet excited state, energy transfer from the exciplex, not the host material, is assumed to occur.

Thus, since the emission wavelength of the formed exciplex is longer than the emission wavelength (fluorescence wavelength) of each of the first organic compound 120 (host material) and the second organic compound 122 (assist material), the fluorescence spectrum of the first organic compound 120 (host material) or the fluorescence spectrum of the second organic compound 122 (assist material) can become an emission spectrum located on the longer wavelength side.

Furthermore, the exciplex probably has an extremely small difference between singlet excitation energy and triplet excitation energy. In other words, the emission spectrum of the exciplex from the singlet state and the emission spectrum thereof from the triplet state are highly close to each other. Thus, in the case where a design is implemented such that the emission spectrum of the exciplex (generally the emission spectrum of the exciplex from the singlet state) overlaps with the absorption band of the third organic compound 124 (guest material) which is located on the longest wavelength side as described above, the emission spectrum of the exciplex from the triplet state (which is not observed at room temperature and not observed even at low temperature in many cases) also overlaps with the absorption band of the third organic compound 124 (guest material) which is located on the longest wavelength side. In other words, the efficiency of the energy transfer from the triplet excited state as well as the efficiency of the energy transfer from the singlet excited state can be increased, and as a result, light emission can be efficiently obtained from both the singlet and triplet excited states.

As described above, in the light-emitting element of one embodiment of the present invention, energy is transferred by utilizing the overlap between the emission spectrum of the exciplex formed in the light-emitting layer 113 and the absorption spectrum of the third organic compound 124 (guest material); thus, efficiency of the energy transfer is high.

In addition, the exciplex exists only in an excited state and thus has no ground state capable of absorbing energy. Thus, a phenomenon in which the third organic compound 124 (guest material) is deactivated by energy transfer from the singlet excited state and the triplet excited state of the third organic compound 124 (guest material) to the exciplex before light emission (i.e., light emission efficiency is lowered) does not probably occur in principle.

Note that the above-described exciplex is formed by an interaction between dissimilar molecules in excited states. The exciplex is generally known to be easily formed between a material which has a relatively low LUMO (LUMO: lowest unoccupied molecular orbital) level and a material which has a relatively high HOMO (HOMO: highest occupied molecular orbital) level.

Figure 2B:
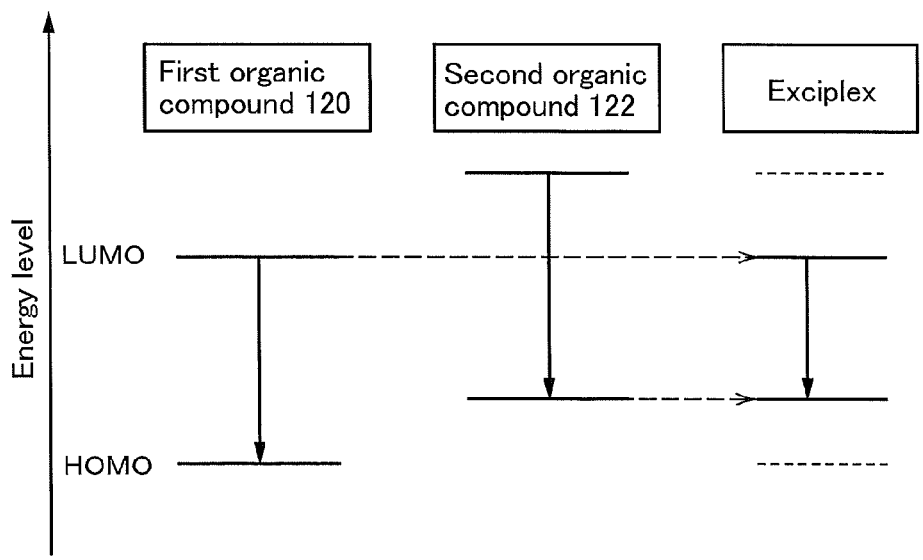

Here, concepts of the energy levels of the first organic compound 120, the second organic compound 122, and the exciplex are described with reference to FIG. 2B. Note that FIG. 2B schematically illustrates the energy levels of the first organic compound 120, the second organic compound 122, and the exciplex.

The HOMO levels and the LUMO levels of the first organic compound 120 (host material) and the second organic compound 122 (assist material) are different from each other. Specifically, the energy levels vary in the following order: the HOMO level of the first organic compound 120< the HOMO level of the second organic compound 122< the LUMO level of the first organic compound 120< the LUMO level of the second organic compound 122. When the exciplex is formed by these two organic compounds, the LUMO level and the HOMO level of the exciplex originate from the first organic compound 120 (host material) and the second organic compound 122 (assist material), respectively (see FIG. 2B).

The emission wavelength of the exciplex depends on a difference in energy between the HOMO level and the LUMO level. As a general tendency, when the energy difference is large, the emission wavelength is short, and when the energy difference is small, the emission wavelength is long.

Therefore, the energy difference of the exciplex is smaller than the energy difference of the first organic compound 120 (host material) and the energy difference of the second organic compound 122 (assist material). In other words, the emission wavelength of the exciplex is longer than the emission wavelength of each of the first organic compound 120 and the second organic compound 122.

Molecular orbital calculations were performed as described below to verify whether or not an exciplex actually has such characteristics. In general, a combination of a heteroaromatic compound and an aromatic amine often forms an exciplex under the influence of the LUMO level of the heteroaromatic compound which is lower than the LUMO level of the aromatic amine (the property of easily accepting electrons) and the HOMO level of the aromatic amine which is higher than the HOMO level of the heteroaromatic compound (the property of easily accepting holes). Thus, calculations were performed using a combination of dibenzo[f,h]quinoxaline (abbreviation: DBq), which is a typical skeleton forming the LUMO of a heteroaromatic compound and is a model of the first organic compound 120 in one embodiment of the present invention, and triphenylamine (abbreviation: TPA), which is a typical skeleton forming the HOMO of an aromatic amine and is a model of the second organic compound 122 in one embodiment of the present invention.

First, the optimal molecular structures and the excitation energies of one molecule of DBq (abbreviation) and one molecule of TPA (abbreviation) in the lowest singlet excited state ($S_1$) and the lowest triplet excited state ($T_1$) were calculated using the time-dependent density functional theory (TD-DFT). Furthermore, the excitation energy of a dimer of DBq (abbreviation) and TPA (abbreviation) was also calculated.

In the density functional theory (DFT), the total energy is represented as the sum of potential energy, electrostatic energy between electrons, electronic kinetic energy, and exchange-correlation energy including all the complicated interactions between electrons. Also in the DFT, an exchange-correlation interaction is approximated by a functional (a function of another function) of one electron potential represented in terms of electron density to enable high-speed and high-accuracy calculations. Here, B3LYP which was a hybrid functional was used to specify the weight of each parameter related to exchange-correlation energy.

In addition, as a basis function, 6-311 (a basis function of a triple-split valence basis set using three contraction functions for each valence orbital) was applied to all the atoms.

By the above basis function, for example, 1s to 3s orbitals are considered in the case of hydrogen atoms, while 1s to 4s and 2p to 4p orbitals are considered in the case of carbon atoms. Furthermore, to improve calculation accuracy, the p function and the d function as polarization basis sets were added to hydrogen atoms and atoms other than hydrogen atoms, respectively.

Note that Gaussian 09 was used as a quantum chemistry computational program. A high performance computer (Altix 4700, manufactured by SGI Japan, Ltd.) was used for the calculations.

Figure 3:
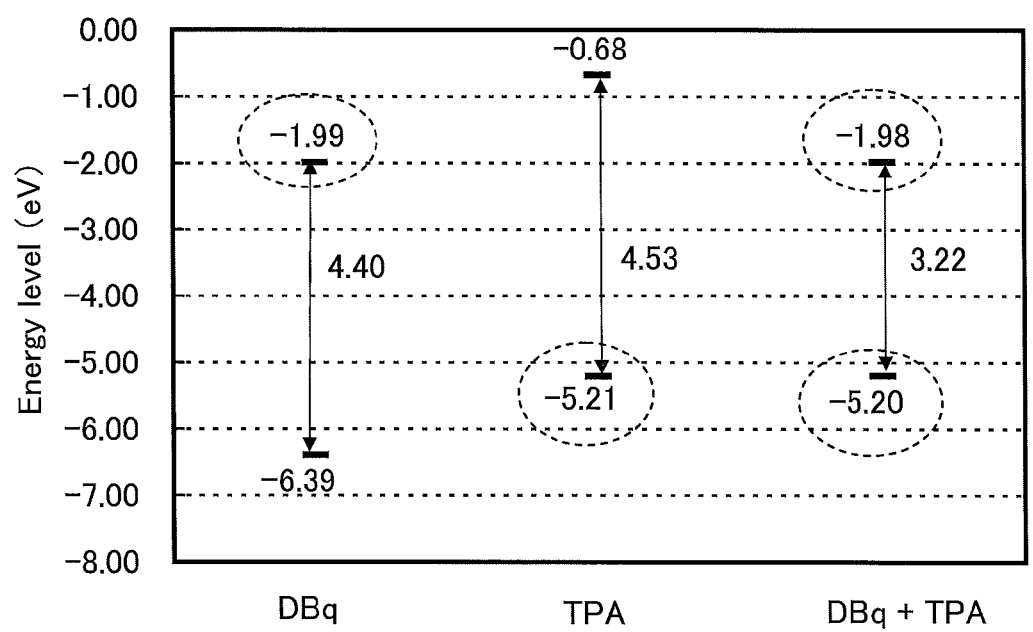
FIG. 3 shows energy levels of one molecule of DBq (abbreviation), one molecule of TPA (abbreviation), and a dimer of DBq (abbreviation) and TPA (abbreviation).

First, the HOMO levels and the LUMO levels of one molecule of DBq (abbreviation), one molecule of TPA (abbreviation), and a dimer of DBq (abbreviation) and TPA (abbreviation) were calculated. FIG. 3 shows the HOMO levels and the LUMO levels.

As shown in FIG. 3, it is suggested that the dimer of DBq (abbreviation) and TPA (abbreviation) forms an exciplex of DBq (abbreviation) and TPA (abbreviation) under the influence of the LUMO level (−1.99 eV) of DBq (abbreviation) which is lower than the LUMO level of TPA (abbreviation) and the HOMO level (−5.21 eV) of TPA (abbreviation) which is higher than the HOMO level of DBq (abbreviation).

FIGS. 4A to 4F show distribution of HOMO and LUMO of one molecule of DBq (abbreviation), one molecule of TPA (abbreviation), and a dimer of DBq (abbreviation) and TPA (abbreviation).

Figure 4A:
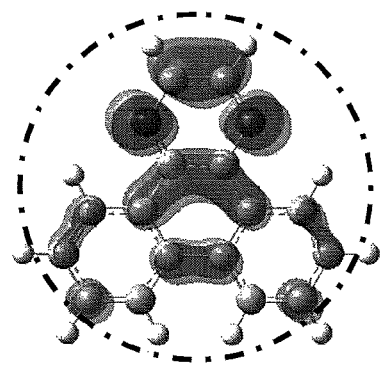
FIGS. 4A to 4F each illustrate distribution of HOMO and LUMO of one molecule of DBq (abbreviation), one molecule of TPA (abbreviation), and a dimer of DBq (abbreviation) and TPA (abbreviation).
Figure 4B:
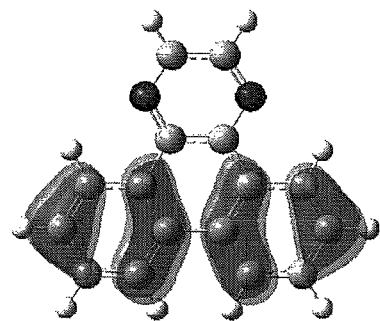
Figure 4C:
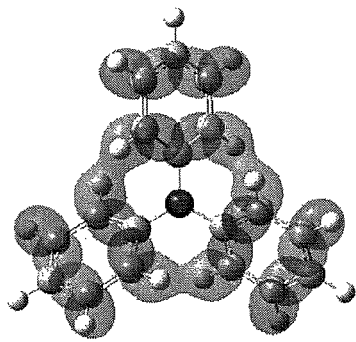
Figure 4D:
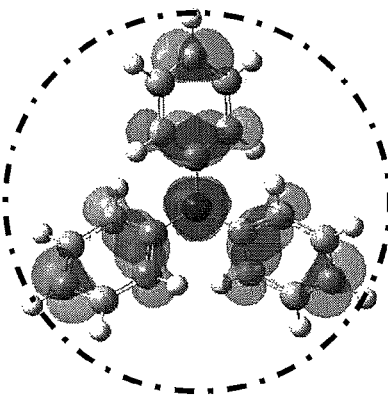
Figure 4E:
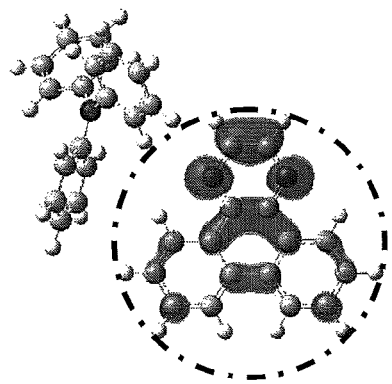
Figure 4F:
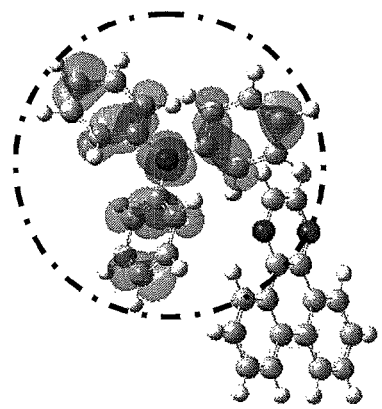

Note that FIG. 4A shows the LUMO distribution of one molecule of DBq (abbreviation), FIG. 4B shows the HOMO distribution of one molecule of DBq, FIG. 4C shows the LUMO distribution of one molecule of TPA (abbreviation), FIG. 4D shows the HOMO distribution of one molecule of TPA (abbreviation), FIG. 4E shows the LUMO distribution of the dimer of DBq (abbreviation) and TPA (abbreviation), and FIG. 4F shows the HOMO distribution of the dimer of DBq (abbreviation) and TPA (abbreviation).

As shown in FIGS. 4E and 4F, the LUMO of the dimer of DBq (abbreviation) and TPA (abbreviation) is distributed on the DBq (abbreviation) side, and the HOMO thereof is distributed on the TPA (abbreviation) side, which is consistent with the results shown in FIG. 3.

The process of the exciplex formation in one embodiment of the present invention can be either of the two processes described below.

One process of the exciplex formation is that an exciplex is formed from the first organic compound 120 (host material) and the second organic compound 122 (assist material) having carriers (cation or anion).

In general, when an electron and a hole are recombined in a host material, excitation energy is transferred from the host material in an excited state to a guest material, whereby the guest material is brought into an excited state to emit light. Before the excitation energy is transferred from the host material to the guest material, the host material itself emits light or the excitation energy turns into thermal energy, which leads to partial deactivation of the excitation energy.

However, in one embodiment of the present invention, an exciplex is formed from the first organic compound 120 (host material) and the second organic compound 122 (assist material) having carriers (cation or anion); therefore, the formation of a singlet exciton of the first organic compound 120 (host material) can be suppressed. In other words, there can be a process where an exciplex is directly formed without formation of a singlet exciton. Thus, deactivation of the singlet excitation energy can be inhibited. Thus, a light-emitting element with a long lifetime can be obtained.

For example, in the case where the first organic compound 120 is an electron-trapping compound having the property of easily capturing electrons (carrier) (having a low LUMO level) among electron-transport materials and the second organic compound 122 is a hole-trapping compound having the property of easily capturing holes (carrier) (having a high HOMO level) among hole-transport materials, an exciplex is formed directly from an anion of the first organic compound 120 and a cation of the second organic compound 122. An exciplex formed through such a process is particularly referred to as an electroplex.

A light-emitting element with high emission efficiency can be obtained by suppressing the generation of the singlet excited state of the first organic compound 120 (host material) and transferring energy from an electroplex to the third organic compound 124 (guest material), in the above-described manner. Note that in this case, the generation of the triplet excited state of the first organic compound 120 (host material) is similarly suppressed and an exciplex is directly formed; therefore, energy transfer probably occurs from the exciplex to the third organic compound 124 (guest material).

The other process of the exciplex formation is an elementary process where one of the first organic compound 120 (host material) and the second organic compound 122 (assist material) forms a singlet exciton and then interacts with the other in the ground state to form an exciplex. Unlike an electroplex, a singlet excited state of the first organic compound 120 (host material) or the second organic compound 122 (assist material) is temporarily generated in this case, but this is rapidly converted into an exciplex; thus, deactivation of singlet excitation energy can be inhibited. Thus, it is possible to inhibit deactivation of excitation energy of the first organic compound 120 or the second organic compound 122. Note that in this case, probably, the triplet excited state of the first organic compound 120 (host material) is similarly rapidly converted into an exciplex and energy is transferred from the exciplex to the third organic compound 124 (guest material).

Note that, in the case where the first organic compound 120 (host material) is an electron-trapping compound, the second organic compound 122 (assist material) is a hole-trapping compound, and the difference between the HOMO levels and the difference between the LUMO levels of these compounds are large (specifically, 0.3 eV or more), electrons are selectively injected into the first organic compound 120 (host material) and holes are selectively injected into the second organic compound 122 (assist material). In this case, the process where an electroplex is formed probably takes precedence over the process where an exciplex is formed through a singlet exciton.

Next, calculation results of excitation energies are shown. The $S_1$ excitation energy of one molecule of DBq (abbreviation) is 3.294 eV, and the fluorescence wavelength is 376.4 nm. The $T_1$ excitation energy of one molecule of DBq (abbreviation) is 2.460 eV, and the phosphorescence wavelength is 504.1 nm. In contrast, the $S_1$ excitation energy of one molecule of TPA (abbreviation) is 3.508 eV, and the fluorescence wavelength is 353.4 nm. The $T_1$ excitation energy of one molecule of TPA (abbreviation) is 2.610 eV, and the phosphorescence wavelength is 474.7 nm.

Here, excitation energies obtained from the optimal molecular structures of the dimer of DBq (abbreviation) and TPA (abbreviation) at $S_1$ and $T_1$ levels are shown. The $S_1$ excitation energy of the dimer of DBq (abbreviation) and TPA (abbreviation) is 2.036 eV, and the fluorescence wavelength is 609.1 nm. The $T_1$ excitation energy of the dimer of DBq (abbreviation) and TPA (abbreviation) is 2.030 eV, and the phosphorescence wavelength is 610.0 nm.

The above shows that the fluorescence wavelength of the dimer of DBq (abbreviation) and TPA (abbreviation) is longer than the fluorescence wavelength of one molecule of DBq (abbreviation) and the fluorescence wavelength of one molecule of TPA (abbreviation). The above also shows that the difference between the fluorescence wavelength and the phosphorescence wavelength of the dimer of DBq (abbreviation) and TPA (abbreviation) is only 0.9 nm and that these wavelengths are substantially the same.

These results indicate that the exciplex can integrate the singlet excitation energy and the triplet excitation energy into substantially the same energy. Therefore, it is indicated as described above that the exciplex can efficiently transfer energy to the phosphorescent compound from both the singlet state and the triplet state thereof.

Such an effect is specific to the use of an exciplex as a medium for energy transfer. In general, energy transfer from the singlet excited state or triplet excited state of a host material to a phosphorescent compound is considered. On the other hand, one embodiment of the present invention greatly differs from a conventional technique in that an exciplex of a host material and another material is formed first and energy transfer from the exciplex is used. In addition, this difference provides unprecedentedly high emission efficiency.

Note that in general, the use of an exciplex for a light-emitting layer of a light-emitting element has a value such as being capable of controlling the emission color, but usually causes a significant decrease in emission efficiency. Therefore, the use of an exciplex has been considered unsuitable for obtaining a highly efficient light-emitting element. However, the present inventors have found that the use of an exciplex as a medium for energy transfer enables, on the contrary, emission efficiency to be maximized as shown in one embodiment of the present invention. This technical idea conflicts with the conventional fixed idea.

In order to make the emission spectrum of the exciplex and the absorption spectrum of the third organic compound 124 (guest material) sufficiently overlap each other, the difference between the energy of a peak of the emission spectrum and the energy of a peak of the absorption band on the lowest energy side in the absorption spectrum is preferably 0.3 eV or less. The difference is more preferably 0.2 eV or less, even more preferably 0.1 eV or less.

It is preferable that, in the light-emitting element which is one embodiment of the present invention, the excitation energy of the exciplex be sufficiently transferred to the third organic compound 124 (guest material) and that light emission from the exciplex be not substantially observed. Thus, energy is preferably transferred to the third organic compound 124 (guest material) through the exciplex so that the third organic compound 124 emits phosphorescence. Note that the third organic compound 124 is preferably a light-emitting material which converts triplet excitation energy into light emission, and is particularly preferably a phosphorescent compound.

Next, concepts of the energy levels of the hole-transport layer 112 and the light-emitting layer 113, which are one embodiment of the present invention, will be described with reference to FIGS. 5A to 5C. Note that FIGS. 5A to 5C schematically illustrate the energy levels of the hole-transport layer 112 (hole-transport layers 112a, 112b, and 112c) and the light-emitting layer 113.

Figure 5A:
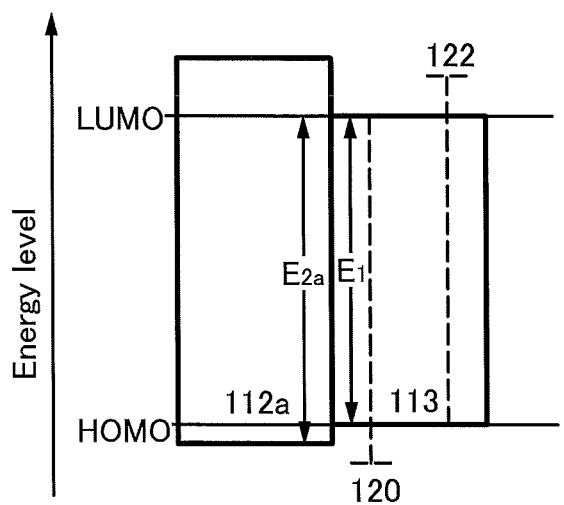
FIGS. 5A to 5C illustrate concepts of energy levels of hole-transport layers and a light-emitting layer of one embodiment of the present invention.
Figure 5B:
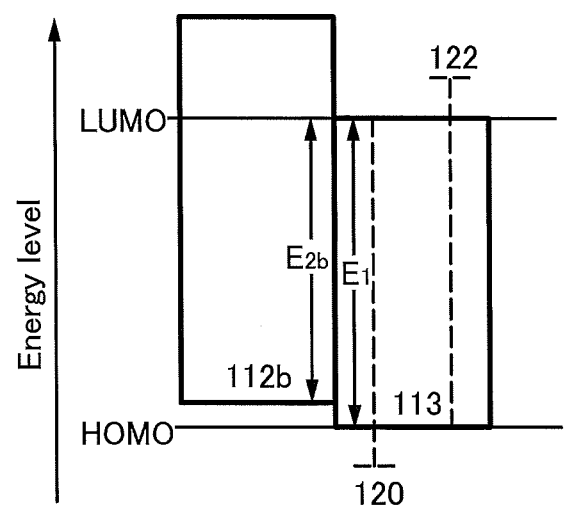
Figure 5C:
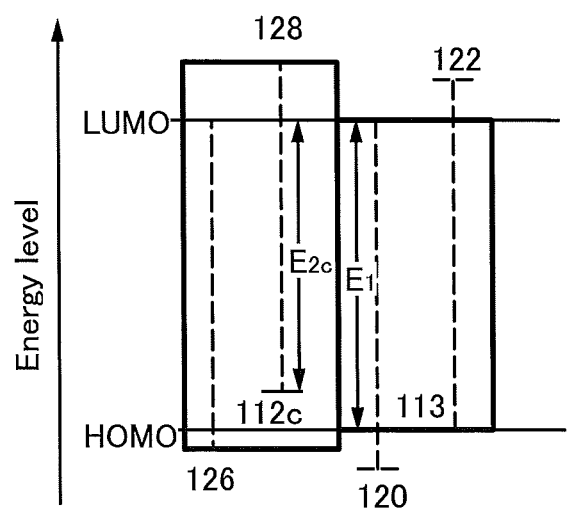

Note that in the light-emitting layer 113 illustrated in FIGS. 5A to 5C, the above-described combination of the first organic compound 120 and the second organic compound 122 forms an exciplex.

FIG. 5A illustrates, as an example, the energy levels of the hole-transport layer 112a formed of one kind of organic compound whose $T_1$ level is higher than that of the second organic compound 122 (assist material) and whose HOMO level is lower than that of the second organic compound 122 (assist material).

In the case of the structure illustrated in FIG. 5A, the HOMO level of the hole-transport layer 112a is lower than the HOMO level of the light-emitting layer 113 in which an exciplex is formed; thus, the entry of holes into deeper regions of the light-emitting layer 113 from the hole-transport layer 112a is facilitated, which enables the emission efficiency of the light-emitting layer 113 to be increased. Meanwhile, turn-on voltage is determined by the energy of $E_1$ (energy difference between the LUMO and HOMO levels of the light-emitting layer 113 in which an exciplex is formed) illustrated in FIG. 5A and cannot be lower than voltage corresponding to the energy. For example, when $E_1$ is 2 eV, the turn-on voltage cannot be lower than 2 V. This is because in the case of the structure illustrated in FIG. 5A, the energy of $E_{2a}$ (energy difference between the LUMO level of the light-emitting layer 113 in which an exciplex is formed and the HOMO level of the hole-transport layer 112a) is higher than the energy of $E_1$.

Next, FIG. 5B illustrates, as an example, the energy levels of the hole-transport layer 112b formed of one kind of organic compound whose $T_1$ level is higher than that of the second organic compound 122 (assist material) and whose HOMO level is higher than that of the second organic compound 122 (assist material).

In the case of the structure illustrated in FIG. 5B, the HOMO level of the hole-transport layer 112b is higher than the HOMO level of the light-emitting layer 113 in which an exciplex is formed; thus, driving voltage (particularly, turn-on voltage) depends on the HOMO level of the hole-transport layer 112b. Specifically, turn-on voltage is determined by the energy of $E_{2b}$ (energy difference between the LUMO level of the light-emitting layer 113 in which an exciplex is formed and the HOMO level of the hole-transport layer 112b) illustrated in FIG. 5B. Thus, in the case of the structure illustrated in FIG. 5B, the energy of $E_{2b}$ is lower than the energy of $E_1$ (energy difference between the LUMO and HOMO levels of the light-emitting layer 113 in which an exciplex is formed); accordingly, the turn-on voltage can be reduced. However, holes are not easily transported from the hole-transport layer 112b to the light-emitting layer 113, which leads to a reduction in emission efficiency particularly in a high luminance (practical luminance) region.

Next, FIG. 5C illustrates, as an example, the energy levels of the hole-transport layer 112c which contains at least the fourth organic compound 126 whose HOMO level is lower than or equal to that of the second organic compound 122 (assist material) and the fifth organic compound 128 whose HOMO level is higher than that of the second organic compound 122 (assist material). The energy levels of the hole-transport layer 112c illustrated in FIG. 5C are a concept of one embodiment of the present invention.

In the case of the structure illustrated in FIG. 5C, the HOMO level of the hole-transport layer 112c can be lower than or equal to the HOMO level of the second organic compound 122 (assist material) owing to the fourth organic compound 126. Thus, the entry of holes into deeper regions of the light-emitting layer 113 from the hole-transport layer 112c is facilitated, which enables the emission efficiency of the light-emitting layer 113 to be increased. Further, driving voltage (particularly, turn-on voltage) depends on the HOMO level of the hole-transport layer 112c. The HOMO level of the hole-transport layer 112c is affected by the fifth organic compound 128. The LUMO level of the hole-transport layer 112c is affected by the fourth organic compound 126. That is, the turn-on voltage is determined by the energy of $E_{2c}$ (energy difference between the LUMO level of the light-emitting layer 113 in which an exciplex is formed and the HOMO level of the fifth organic compound 128) shown in FIG. 5C. Thus, in the case of the structure illustrated in FIG. 5C, since the energy of $E_{2c}$ is lower than the energy of $E_1$ (energy difference between the LUMO and HOMO levels of the light-emitting layer 113 in which an exciplex is formed), the turn-on voltage can be reduced.

With the structure illustrated in FIG. 5C, recombination current can flow with electric energy lower than the emission energy of the light-emitting layer 113. It is generally thought that turn-on voltage is voltage corresponding to the emission energy of the light-emitting layer 113 and operation does not start at voltage lower than the voltage. However, the turn-on voltage in one embodiment of the present invention is affected by the fifth organic compound 128 contained in the hole-transport layer 112c, and thus can be lower than the previously commonly accepted turn-on voltage. Further, although the emission efficiency is probably low at the time of the start of driving because of the contribution of the fifth organic compound 128 to the generation of excitation energy, the luminance is too low to allow visual recognition at the time of the start of driving; thus, practical problems are not caused. In fact, when the luminance is practical luminance (specifically, higher than or equal to 1 cd/m$^2$), hole injection from the fourth organic compound 126 to the light-emitting layer 113 is mainly performed and the fifth organic compound 128 is hardly responsible for hole injection into the light-emitting layer 113 or an excited state; thus, high emission efficiency can be obtained.

As described above, in the light-emitting element described in this embodiment, the hole-transport layer 112c contains at least the fourth organic compound 126 whose HOMO level is lower than or equal to that of the second organic compound 122 (assist material) and the fifth organic compound 128 whose HOMO level is higher than that of the second organic compound 122 (assist material). The fourth organic compound 126 of the hole-transport layer 112c has a function of injecting holes into the light-emitting layer 113 (mainly the second organic compound 122 (assist material) in the light-emitting layer 113), so that the emission efficiency can be increased. Further, the HOMO level of the fifth organic compound 128 of the hole-transport layer 112c is higher than that of the second organic compound 122 (assist material); thus, the driving voltage, particularly turn-on voltage, for the light-emitting layer can be reduced. These effects can be obtained only when the hole-transport layer contains the two or more kinds of organic compounds and the above-described relation of the HOMO levels exists.

When a phosphorescent compound is used as the first organic compound 120 (host material) in the light-emitting element of one embodiment of the present invention, the first organic compound 120 itself is likely to emit light and unlikely to allow energy to be transferred to the third organic compound 124 (guest material). In this case, it is favorable if the first organic compound 120 could emit light efficiently, but it is difficult to achieve high emission efficiency because the first organic compound 120 (host material) causes a problem of concentration quenching. Thus, the case where at least one of the first organic compound 120 (host material) and the second organic compound 122 (assist material) is a fluorescent compound (i.e., a compound which is likely to undergo light emission or thermal deactivation from the singlet excited state) is effective. Therefore, it is preferable that at least one of the first organic compound 120 and the second organic compound 122 be a fluorescent compound.

As described above, in the light-emitting element described in this embodiment, the efficiency of energy transfer can be improved owing to energy transfer utilizing an overlap between an emission spectrum of an exciplex and an absorption spectrum of the third organic compound (guest material); accordingly, the light-emitting element can have high emission efficiency.

Further, in the light-emitting element described in this embodiment, the fourth organic compound whose HOMO level is lower than or equal to that of the second organic compound with a hole-transport property used in the light-emitting layer, and the fifth organic compound whose HOMO level is higher than that of the second organic compound are used in the hole-transport layer. Such a structure makes it possible to increase the current efficiency of the light-emitting element and to reduce the voltage, particularly turn-on voltage, of the light-emitting element.

Note that the structure described in this embodiment can be combined as appropriate with any of the structures described in the other embodiments.

(Embodiment 2)

In this embodiment, a modified example of the light-emitting element in Embodiment 1 will be described with reference to FIG. 6. Note that portions having functions similar to those of the portions in the light-emitting element in Embodiment 1 are denoted by the same reference numerals, and descriptions of such portions are skipped.

Figure 6:
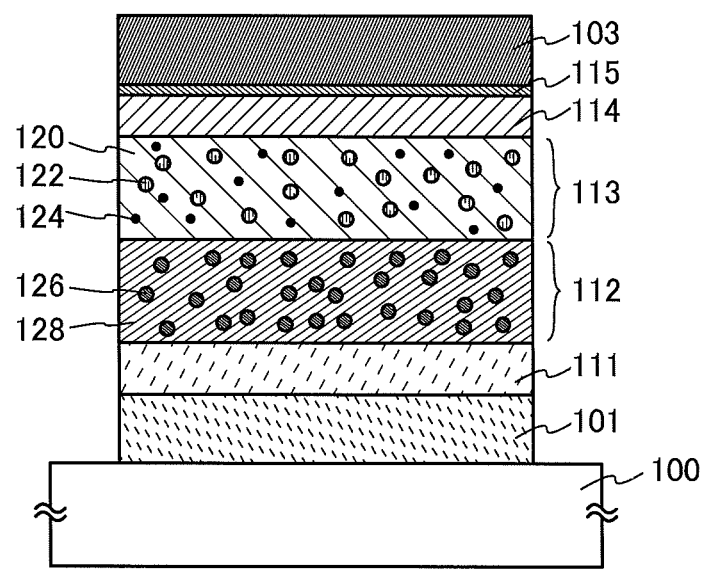
FIG. 6 illustrates a light-emitting element of one embodiment of the present invention.

As illustrated in FIG. 6, the light-emitting element described in this embodiment includes, between a pair of electrodes (the first electrode 101 and the second electrode 103), a hole-injection layer 111, the hole-transport layer 112 over the hole-injection layer 111, the light-emitting layer 113 over the hole-transport layer 112, an electron-transport layer 114 over the light-emitting layer 113, and an electron-injection layer 115 over the electron-transport layer 114. The light-emitting layer 113 contains a first organic compound 120 having an electron-transport property, a second organic compound 122 having a hole-transport property, and a light-emitting third organic compound 124 converting triplet excitation energy into light emission. A combination of the first organic compound 120 and the second organic compound 122 forms an exciplex. The hole-transport layer 112 contains at least a fourth organic compound 126 whose HOMO level is lower than or equal to that of the second organic compound 122 and a fifth organic compound 128 whose HOMO level is higher than that of the second organic compound 122.

Note that in the light-emitting layer 113, the third organic compound 124 (guest material) is dispersed in the first organic compound 120 (host material) and the second organic compound 122 (assist material), so that concentration quenching due to high concentration in the light-emitting layer 113 can be suppressed; thus, the emission efficiency of the light-emitting element can be increased.

The combination of the first organic compound 120 (host material) and the second organic compound 122 (assist material) forms an exciplex.

A specific example in which the light-emitting element described in this embodiment is manufactured will be described below.

A substrate 100 is used as a support of the light-emitting element. For example, glass, quartz, plastic, or the like can be used for the substrate 100. Furthermore, a flexible substrate may be used. The flexible substrate is a substrate that can be bent, such as a plastic substrate made of polycarbonate, polyarylate, or polyether sulfone, for example. Alternatively, a film (made of polypropylene, polyester, polyvinyl fluoride, polyvinyl chloride, or the like), an inorganic film formed by evaporation, or the like can be used. Note that another substrate can be used as long as it can function as a support in a process of manufacturing the light-emitting element.

As the first electrode 101 and the second electrode 103, a metal, an alloy, an electrically conductive compound, a mixture thereof, and the like can be used. Specifically, indium oxide-tin oxide (ITO: indium tin oxide), indium oxide-tin oxide containing silicon or silicon oxide, indium oxide-zinc oxide, indium oxide containing tungsten oxide and zinc oxide, gold (Au), platinum (Pt), nickel (Ni), tungsten (W), chromium (Cr), molybdenum (Mo), iron (Fe), cobalt (Co), copper (Cu), palladium (Pd), or titanium (Ti) can be used. In addition, an element belonging to Group 1 or Group 2 of the periodic table, for example, an alkali metal such as lithium (Li) or cesium (Cs), an alkaline earth metal such as magnesium (Mg), calcium (Ca), or strontium (Sr), an alloy containing such an element (e.g., MgAg or AlLi), a rare earth metal such as europium (Eu) or ytterbium (Yb), an alloy containing such an element, graphene, or the like can be used. Note that the first electrode 101 and the second electrode 103 can be formed by, for example, a sputtering method, an evaporation method (including a vacuum evaporation method), or the like. Note that in this embodiment, the first electrode 101 is used as an anode and the second electrode 103 is used as a cathode.

As the substance having a high hole-transport property used for the hole-injection layer 111 and the hole-transport layer 112, the following can be given, for example: aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4"-tris(carbazol-9-yl)triphenylamine (abbreviation: TCTA), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB); 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like. The following carbazole derivative can also be used: 4,4'-di(N-carbazolyl)biphenyl (abbreviation: CBP), 1,3,5-tris[4-(N-carbazolyl)phenyl]benzene (abbreviation: TCPB), and 9-[4-(10-phenyl-9-anthryl)phenyl]-9H-carbazole (abbreviation: CzPA). Hole-transport materials given below can also be used. The substances given here are mainly ones that have a hole mobility of $10^{-6}$ cm$^2$/Vs or higher. Note that any substance other than the above substances may be used as long as the hole-transport property thereof is higher than the electron-transport property thereof.

A high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine] (abbreviation: Poly-TPD) can also be used for the hole-injection layer 111 and the hole-transport layer 112.

As examples of the acceptor substance that can be used for the hole-injection layer 111, transition metal oxides and oxides of metals belonging to Group 4 to Group 8 of the periodic table can be given. Specifically, molybdenum oxide is particularly preferable.

For the hole-transport layer 112, substances used as the fourth organic compound 126 whose HOMO level is lower than or equal to that of the second organic compound 122 (assist material) and the fifth organic compound 128 whose HOMO level is higher than that of the second organic compound 122 (assist material) may be selected from the substances given above. Note that the substances used as the fourth organic compound 126 and the fifth organic compound 128 are not limited to the substances given above and the substances can be selected as appropriate by practitioners depending on the substance used as the second organic compound 122 (assist material).

The light-emitting layer 113 contains the first organic compound 120 (host material), the second organic compound 122 (assist material), and the third organic compound 124 (guest material).

An electron-transport material is preferably used as the first organic compound 120 (host material). A hole-transport material is preferably used as the second organic compound 122 (assist material). A light-emitting material which converts triplet excitation energy into light emission is preferably used as the third organic compound 124 (guest material).

As the electron-transport material, a π-electron deficient heteroaromatic compound such as a nitrogen-containing heteroaromatic compound is preferable; for example, the following can be given: heterocyclic compounds (e.g., an oxadiazole derivative, an imidazole derivative, and a triazole derivative) having polyazole skeletons, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBTBIm-II); heterocyclic compounds (e.g., a pyrazine derivative, a pyrimidine derivative, a pyridazine derivative, a quinoxaline derivative, and a dibenzoquinoxaline derivative) having diazine skeletons, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), and 4,6-bis[3-(4-dibenzothienyl)phenyl]pyrimidine (abbreviation: 4,6mDBTP2Pm-II); and heterocyclic compounds (e.g., a pyridine derivative, a quinoline derivative, and a dibenzoquinoline derivative) having pyridine skeletons, such as 3,5-bis[3-(9H-carbazol-9-yl)phenyl]pyridine (abbreviation: 35DCzPPy) and 1,3,5-tri[3-(3-pyridyl)-phenyl]benzene (abbreviation: TmPyPB). Among the materials given above, the heterocyclic compound having a diazine skeleton and the heterocyclic compound having a pyridine skeleton have high reliability and are thus preferable. Specifically, the heterocyclic compound having a diazine (pyrimidine or pyrazine) skeleton has a high electron-transport property to contribute to a reduction in driving voltage.

As the hole-transport material, a π-electron rich heteroaromatic compound (e.g., a carbazole derivative or an indole derivative) or an aromatic amine compound is preferable; for example, the following can be given: compounds having aromatic amine skeletons, such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)-triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluorene-2-amine (abbreviation: PCBAF), and N-phenyl-N-[4-(9-phenyl-9H-carbazol-3-yl)phenyl]Spiro-9,9'-bifluoren-2-amine (abbreviation: PCBASF); compounds having carbazole skeletons, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), and 3,3'-bis(9-phenyl-9H-carbazole) (abbreviation: PCCP); compounds having thiophene skeletons, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having furan skeletons, such as 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the materials given above, the compound having an aromatic amine skeleton and the compound having a carbazole skeleton are preferable because these compounds have high reliability and high hole-transport properties to contribute to a reduction in driving voltage.

Note that it is preferable that these electron-transport materials and hole-transport materials do not have an absorption spectrum in the blue wavelength range. Specifically, an absorption edge of the absorption spectrum is preferably at 440 nm or less.

Meanwhile, examples of the light-emitting material which converts triplet excitation energy into light emission include a phosphorescent material and a thermally activated delayed fluorescent (TADF) material exhibiting thermally activated delayed fluorescence.

As the phosphorescent material, for example, a phosphorescent material having an emission peak at 440 nm to 520 nm is given, examples of which include organometallic iridium complexes having 4H-triazole skeletons, such as tris{2-[5-(2-methylphenyl)-4-(2,6-dimethylphenyl)-4H-1,2,4-triazol-3-yl-κN²]phenyl-κC}iridium(III) (abbreviation: Ir(mpptz-dmp)₃), tris(5-methyl-3,4-diphenyl-4H-1,2,4-triazolato) iridium(III) (abbreviation: [Ir(Mptz)₃], and tris[4-(3-biphenyl)-5-isopropyl-3-phenyl-4H-1,2,4-triazolato]iridium (III) (abbreviation: Ir(iPrptz-3b)₃); organometallic iridium complexes having 1H-triazole skeletons, such as tris[3-methyl-1-(2-methylphenyl)-5-phenyl-1H-1,2,4-triazolato]iridium(III) (abbreviation: [Ir(Mptz1-mp)₃]) and tris(1-methyl-5-phenyl-3-propyl-1H-1,2,4-triazolato)iridium(III) (abbreviation: Ir(Prptz1-Me)₃); organometallic iridium complexes having imidazole skeletons, such as fac-tris[1-(2,6-diisopropylphenyl)-2-phenyl-1H-imidazole]iridium(III) (abbreviation: Ir(iPrpmi)₃) and tris[3-(2,6-dimethylphenyl)-7-methylimidazo[1,2-f]phenanthridinato]iridium(III) (abbreviation: Ir(dmpimpt-Me)₃); and organometallic iridium complexes in which a phenylpyridine derivative having an electron-withdrawing group is a ligand, such as bis[2-(4',6'-difluorophenyl)pyridinato-N,C²']iridium(III) tetrakis(1-pyrazolyl)borate (abbreviation: FIr6), bis[2-(4',6'-difluorophenyl)pyridinato-N,C²']iridium(III) picolinate (abbreviation: FIrpic), bis{2-[3',5'-bis(trifluoromethyl)phenyl]pyridinato-N,C²¹}iridium(III) picolinate (abbreviation: Ir(CF₃ppy)₂(pic)), and bis[2-(4',6'-difluorophenyl)pyridinato-N,C²']iridium(III) acetylacetonate (abbreviation: Fir(acac)). Among the materials given above, the organometallic iridium complex having a 4H-triazole skeleton has high reliability and high emission efficiency and is thus especially preferable.

Examples of the phosphorescent material having an emission peak at 520 nm to 600 nm include organometallic iridium complexes having pyrimidine skeletons, such as tris(4-methyl-6-phenylpyrimidinato)iridium(III) (abbreviation: Ir(mppm)₃), tris(4-t-butyl-6-phenylpyrimidinato)iridium(II) (abbreviation: Ir(tBuppm)₃), (acetylacetonato)bis(6-methyl-4-phenylpyrimidinato)iridium(III) (abbreviation: Ir(mppm)₂(acac)), (acetylacetonato)bis(6-tert-butyl-4-phenylpyrimidinato)iridium(III) (abbreviation: Ir(tBuppm)₂(acac)), (acetylacetonato)bis[4-(2-norbornyl)-6-phenylpyrimidinato]iridium(III) (endo- and exo-mixture) (abbreviation: Ir(nbppm)₂(acac)), (acetylacetonato)bis[5-methyl-6-(2-methylphenyl)-4-phenylpyrimidinato]iridium (III) (abbreviation: Ir(mpmppm)₂(acac)), and (acetylacetonato)bis(4,6-diphenylpyrimidinato)iridium(III) (abbreviation: Ir(dppm)₂(acac)); organometallic iridium complexes having pyrazine skeletons, such as (acetylacetonato)bis(3,5-dimethyl-2-phenylpyrazinato)iridium(III) (abbreviation: Ir(mppr-Me)₂(acac)) and (acetylacetonato)bis(5-isopropyl-3-methyl-2-phenylpyrazinato)iridium(III) (abbreviation: Ir(mppr-iPr)₂(acac)); organometallic iridium complexes having pyridine skeletons, such as tris(2-phenylpyridinato-N,C²')iridium(III) (abbreviation: Ir(ppy)₃), bis(2-phenylpyridinato-N,C²')iridium(III) acetylacetonate (abbreviation: Ir(ppy)₂acac), bis(benzo[h]quinolinato)iridium (III) acetylacetonate (abbreviation: Ir(bzq)₂(acac)), tris(benzo[h]quinolinato)iridium(III) (abbreviation: Ir(bzq)₃), tris(2-phenylquinolinato-N,C²')iridium(III) (abbreviation: Ir(pq)₃, and bis(2-phenylquinolinato-N,C²')iridium(III) acetylacetonate (abbreviation: Ir(pq)₂(acac)); and a rare earth metal complex such as tris(acetylacetonato) (monophenanthroline)terbium(III) (abbreviation: Tb(acac)₃(Phen)). Among the materials given above, the organometallic iridium complex having a pyrimidine skeleton has distinctively high reliability and emission efficiency and is thus especially preferable.

Examples of the phosphorescent material having an emission peak at 600 nm to 700 nm include organometallic iridium complexes having pyrimidine skeletons, such as bis[4,6-bis(3-methylphenyl)pyrimidinato](diisobutylylmethano)iridium(III) (abbreviation: Ir(5mdppm)₂(dibm)), bis[4,6-bis(3-methylphenyl)pyrimidinato](dipivaloylmethanato)iridium (III) (abbreviation: Ir(5mdppm)₂(dpm)), and bis[4,6-di(naphthalen-1-yl)pyrimidinato](dipivaloylmethanato) iridium(III) (abbreviation: Ir(d1npm)₂(dpm)); organometallic iridium complexes having pyrazine skeletons, such as (acetylacetonato)bis(2,3,5-triphenylpyrazinato)iridium(III) (abbreviation: Ir(tppr)₂(acac)), bis(2,3,5-triphenylpyrazinato) (dipivaloylmethanato)iridium(III) (abbreviation: Ir(tppr)₂(dpm)), or (acetylacetonato)bis[2,3-bis(4-fluorophenyl)quinoxalinato]iridium(III) (abbreviation: Ir(Fdpq)₂(acac)); organometallic iridium complexes having pyridine skeletons, such as tris(1-phenylisoquinolinato-N, C²')iridium(III) (abbreviation: Ir(piq)₃) and bis(1-phenylisoquinolinato-N,C²')iridium(III)acetylacetonate (abbreviation: Ir(piq)₂acac); a platinum complex such as 2,3,7,8,12,13,17,18-octaethyl-21H,23H-porphyrin platinum(II) (abbreviation: PtOEP); and rare earth metal complexes such as tris(1, 3-diphenyl-1,3-propanedionato)(monophenanthroline) europium(III) (abbreviation: Eu(DBM)₃(Phen)) and tris[1-(2-thenoyl)-3,3,3-trifluoroacetonato](monophenanthroline) europium(III) (abbreviation: Eu(TTA)₃(Phen)). Among the materials given above, the organometallic iridium complex having a pyrazine skeleton has distinctively high reliability and emission efficiency and is thus especially preferable. Further, the organometallic iridium complex having a pyrazine skeleton can provide red light emission with favorable chromaticity.

Note that "delayed fluorescence" exhibited by the TADF material refers to light emission having the same spectrum as normal fluorescence and an extremely long lifetime. The lifetime is $10^{-6}$ seconds or longer, preferably $10^{-3}$ seconds or longer. Specific examples of the TADF material includes fullerene, a derivative thereof, an acridine derivative such as proflavine, and eosin. A metal-containing porphyrin such as a porphyrin containing magnesium (Mg), zinc (Zn), cadmium (Cd), tin (Sn), platinum (Pt), indium (In), or palladium (Pd) can also be given. Examples of the metal-containing porphyrin include a protoporphyrin-tin fluoride complex ($SnF_2$ (Proto IX)), a mesoporphyrin-tin fluoride complex ($SnF_2$ (Meso IX)), a hematoporphyrin-tin fluoride complex ($SnF_2$ (Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2$(OEP)). Alternatively, a heterocyclic compound including a π-electron rich heteroaromatic ring and a π-electron deficient heteroaromatic ring can be used, such as 2-(biphenyl-4-yl)-4,6-bis(12-phenylindolo[2,3-α] carbazol-1'-yl)-1,3,5-triazine (abbreviation: PIC-TRZ). Note that a material in which the π-electron rich heteroaromatic ring is directly bonded to the π-electron deficient heteroaromatic ring is particularly preferably used, in which case the donor property of the π-electron rich heteroaromatic ring and the acceptor property of the π-electron deficient heteroaromatic ring are both increased and the energy difference between the $S_1$ level and the $T_1$ level becomes small.

Note that materials which can be used as the first organic compound 120 (host material), the second organic compound 122 (assist material), and the third organic compound 124 (guest material) are not limited to those given above. The combination is determined so that an exciplex can be formed, the emission spectrum of the exciplex overlaps with the absorption spectrum of the third organic compound 124 (guest material), and the peak of the emission spectrum of the exciplex has a longer wavelength than the peak of the absorption spectrum of the third organic compound 124 (guest material).

In the case where an electron-transport material is used as the first organic compound 120 (host material) and a hole-transport material is used as the second organic compound 122 (assist material), carrier balance can be controlled by the mixture ratio of the compounds. Specifically, the ratio of the first organic compound 120 to the second organic compound 122 is preferably 1:9 to 9:1.

The electron-transport layer 114 is a layer containing a substance having a high electron-transport property. For the electron-transport layer 114, in addition to the electron-transport materials given above, a metal complex such as tris(8-quinolinolato)aluminum (abbreviation: $Alq_3$), tris(4-methyl-8-quinolinolato)aluminum (abbreviation: $Almq_3$), bis(10-hydroxybenzo[h]quinolinato)beryllium (abbreviation: $BeBq_2$), BAlq, $Zn(BOX)_2$, or bis[2-(2-hydroxyphenyl)benzothiazolato]zinc (abbreviation: $Zn(BTZ)_2$) can be used. A heteroaromatic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: Bphen), bathocuproine (abbreviation: BCP), or 4,4'-bis(5-methylbenzoxazol-2-yl)stilbene (abbreviation: BzOs) can also be used. A high molecular compound such as poly(2,5-pyridinediyl) (abbreviation: PPy), poly[(9,9-dihexylfluorene-2,7-diyl)-co-(pyridine-3,5-diyl)] (abbreviation: PF-Py) or poly[(9,9-dioctylfluorene-2,7-diyl)-co-(2,2'-bipyridine-6,6'-diyl)] (abbreviation: PF-BPy) can also be used. The substances given here are mainly ones that have an electron mobility of $10^{-6}$ $cm^2/Vs$ or higher. Note that any substance other than the above substances may be used for the electron-transport layer 114 as long as the electron-transport property thereof is higher than the hole-transport property thereof.

The electron-transport layer 114 is not limited to a single layer, but may be a stack of two or more layers containing any of the above substances.

The electron-injection layer 115 is a layer containing a substance having a high electron-injection property. For the electron-injection layer 115, a compound of an alkali metal or an alkaline earth metal, such as lithium fluoride (LiF), cesium fluoride (CsF), calcium fluoride ($CaF_2$), or lithium oxide ($LiO_x$), can be used. A rare earth metal compound such as erbium fluoride ($ErF_3$) can also be used. Any of the substances for forming the electron-transport layer 114, which are given above, can also be used.

A composite material in which an organic compound and an electron donor (donor) are mixed may also be used for the electron-injection layer 115. Such a composite material is excellent in an electron-injection property and an electron-transport property because the electron donor causes electron generation in the organic compound. In this case, the organic compound is preferably a material excellent in transporting the generated electrons. Specifically, for example, the substances for forming the electron-transport layer 114 (e.g., a metal complex and a heteroaromatic compound), which are described above, can be used. As the electron donor, a substance exhibiting an electron-donating property with respect to the organic compound may be used. Specifically, an alkali metal, an alkaline earth metal, and a rare earth metal are preferable, and lithium, cesium, magnesium, calcium, erbium, ytterbium, and the like can be given. Alkali metal oxides or alkaline earth metal oxides are also preferable, and examples thereof include lithium oxide, calcium oxide, and barium oxide. A Lewis base such as magnesium oxide can also be used. An organic compound such as tetrathiafulvalene (abbreviation: TTF) can also be used.

Note that each of the above-described hole-injection layer 111, hole-transport layer 112, light-emitting layer 113, electron-transport layer 114, and electron-injection layer 115 can be formed by a method such as an evaporation method (e.g., a vacuum evaporation method), an inkjet method, or a coating method.

Light emission obtained in the light-emitting layer 113 of the above-described light-emitting element is extracted to the outside through one or both of the first electrode 101 and the second electrode 103. Thus, one or both of the first electrode 101 and the second electrode 103 in this embodiment is/are an electrode having a light-transmitting property.

As described above, in the light-emitting element described in this embodiment, the efficiency of energy transfer can be improved owing to energy transfer utilizing an overlap between an emission spectrum of an exciplex and an absorption spectrum of the third organic compound (guest material); accordingly, the light-emitting element can have high emission efficiency.

Further, in the light-emitting element described in this embodiment, the fourth organic compound whose HOMO level is lower than or equal to that of the second organic compound having a hole-transport property, which is used in the light-emitting layer, and the fifth organic compound whose HOMO level is higher than that of the second organic compound are used in the hole-transport layer. Such a structure makes it possible to increase the current efficiency of the light-emitting element and to reduce the voltage, particularly turn-on voltage.

Further, the light-emitting element described in this embodiment is one embodiment of the present invention and is particularly characterized by the structures of the hole-transport layer and the light-emitting layer. Thus, when the structure described in this embodiment is employed, a passive matrix light-emitting device, an active matrix light-emitting device, and the like can be manufactured. Each of these light-emitting devices is included in the present invention.

Note that there is no particular limitation on the structure of the TFT in the case of the active matrix light-emitting device. For example, a staggered TFT or an inverted staggered TFT can be used as appropriate. Further, a driver circuit formed over a TFT substrate may be formed using both of an n-type TFT and a p-type TFT or only either an n-type TFT or a p-type TFT. Furthermore, there is no particular limitation on the crystallinity of a semiconductor film used for the TFT. For example, an amorphous semiconductor film, a crystalline semiconductor film, an oxide semiconductor film, or the like can be used.

Note that the structure described in this embodiment can be combined as appropriate with any of the structures described in the other embodiments.

(Embodiment 3)

In this embodiment, as one embodiment of the present invention, a light-emitting element (hereinafter referred to as tandem light-emitting element) in which a charge generation layer is provided between a plurality of light-emitting layers will be described.

Figure 7A:
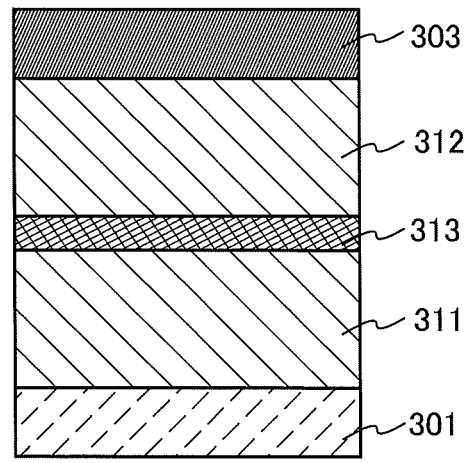
FIGS. 7A and 7B illustrate structures of light-emitting elements.

A light-emitting element described in this embodiment is a tandem light-emitting element including a plurality of light-emitting layers (a first light-emitting layer 311 and a second light-emitting layer 312) between a pair of electrodes (a first electrode 301 and a second electrode 303) as illustrated in FIG. 7A.

In this embodiment, the first electrode 301 functions as an anode and the second electrode 303 functions as a cathode. Note that the first electrode 301 and the second electrode 303 can have structures similar to the structures described in Embodiment 2. In addition, although the plurality of light-emitting layers (the first light-emitting layer 311 and the second light-emitting layer 312) may have structures similar to the structure described in Embodiment 1 or 2, any of the light-emitting layers may have a structure similar to the structure described in Embodiment 1 or 2. In other words, the structures of the first light-emitting layer 311 and the second light-emitting layer 312 may be the same or different from each other and can be similar to the structure described in Embodiment 1 or 2. Note that one or both of the first light-emitting layer 311 and the second light-emitting layer 312 include the hole-transport layer described in Embodiment 1 or 2.

Further, a charge generation layer 313 is provided between the plurality of light-emitting layers (the first light-emitting layer 311 and the second light-emitting layer 312). The charge generation layer 313 has a function of injecting electrons into one of the light-emitting layers and a function of injecting holes into the other of the light-emitting layers when voltage is applied between the first electrode 301 and the second electrode 303. In this embodiment, when voltage is applied such that the potential of the first electrode 301 is higher than that of the second electrode 303, the charge generation layer 313 injects electrons into the first light-emitting layer 311 and injects holes into the second light-emitting layer 312.

Note that in terms of light extraction efficiency, the charge generation layer 313 preferably has a property of transmitting visible light (specifically, the charge generation layer 313 has a visible light transmittance of 40% or higher). Further, the charge generation layer 313 functions even when it has lower conductivity than the first electrode 301 or the second electrode 303.

The charge generation layer 313 may have either a structure in which an electron acceptor (acceptor) is added to an organic compound having a high hole-transport property or a structure in which an electron donor (donor) is added to an organic compound having a high electron-transport property. Alternatively, both of these structures may be stacked.

In the case of the structure in which an electron acceptor is added to an organic compound having a high hole-transport property, as the organic compound having a high hole-transport property, for example, an aromatic amine compound such as NPB, TPD, TDATA, MTDATA, or 4,4'-bis[N-(spiro-9,9'-bifluoren-2-yl)-N-phenylamino]biphenyl (abbreviation: BSPB), or the like can be used. The substances given here are mainly ones that have a hole mobility of $10^{-6}$ cm$^2$/Vs or higher. Note that any substance other than the above substances may be used as long as the hole-transport property thereof is higher than the electron-transport property thereof.

Further, examples of the electron acceptor include 7,7,8,8-tetracyano-2,3,5,6-tetrafluoroquinodimethane (abbreviation: F$_4$-TCNQ), chloranil, and the like. Other examples include transition metal oxides. Other examples include oxides of metals belonging to Group 4 to Group 8 of the periodic table. Specifically, vanadium oxide, niobium oxide, tantalum oxide, chromium oxide, molybdenum oxide, tungsten oxide, manganese oxide, and rhenium oxide are preferable because of their high electron-accepting properties. Among these metal oxides, molybdenum oxide is especially preferable because it is stable in the air, has a low hygroscopic property, and is easily handled.

On the other hand, in the case of the structure in which an electron donor is added to an organic compound having a high electron-transport property, as the organic compound having a high electron-transport property for example, a metal complex having a quinoline skeleton or a benzoquinoline skeleton, such as Alq, Almq$_3$, BeBq$_2$, or BAlq, or the like can be used. Alternatively, a metal complex having an oxazole-based ligand or a thiazole-based ligand, such as Zn(BOX)$_2$ or Zn(BTZ)$_2$ can be used. Other than such a metal complex, PBD, OXD-7, TAZ, BPhen, BCP, or the like can be used. The substances given here are mainly ones that have an electron mobility of $10^{-6}$ cm$^2$/Vs or higher. Note that any substance other than the above substances may be used as long as the electron-transport property thereof is higher than the hole-transport property thereof.

Further, as the electron donor, an alkali metal, an alkaline earth metal, a rare earth metal, a metal belonging to Group 13 of the periodic table, or an oxide or carbonate thereof can be used. Specifically, lithium (Li), cesium (Cs), magnesium (Mg), calcium (Ca), ytterbium (Yb), indium (In), lithium oxide, cesium carbonate, or the like is preferably used. An organic compound such as tetrathianaphthacene may also be used as the electron donor.

By forming the charge generation layer 313 with any of the above materials, it is possible to suppress an increase in driving voltage caused when the light-emitting layers are stacked.

Figure 7B:
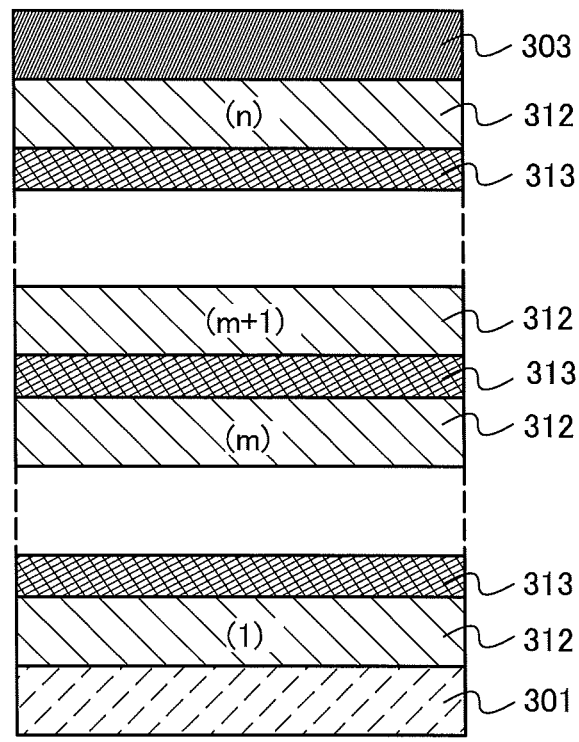

Although FIG. 7A illustrates the light-emitting element including two light-emitting layers, the present invention can be similarly applied to a light-emitting element in which n light-emitting layers (n is three or more) are stacked as illustrated in FIG. 7B. In the case where a plurality of light-emitting layers are provided between a pair of electrodes as in the light-emitting element of this embodiment, by providing a charge generation layer 313 between the light-emitting layers, the light-emitting element can emit light in a high luminance region while the current density is kept low. Since the current density can be kept low, the element can have a long lifetime. When the light-emitting element is applied to lighting, voltage drop due to resistance of an electrode material can be reduced, thereby achieving homogeneous light emission in a large area. Moreover, it is possible to achieve a light-emitting device which can be driven at low voltage and has low power consumption.

Further, by making emission colors of light-emitting layers different, light of a desired color can be obtained from the light-emitting element as a whole. For example, the emission colors of first and second light-emitting layers are complementary in a light-emitting element having the two light-emitting layers, so that the light-emitting element can be made to emit white light as a whole. Note that the term "complementary" means color relationship in which an achromatic color is obtained when colors are mixed. In other words, emission of white light can be obtained by mixture of light emitted from substances whose emission colors are complementary colors.

Further, the same applies to a light-emitting element having three light-emitting layers. For example, the light-emitting element as a whole can emit white light when the emission color of the first light-emitting layer is red, the emission color of the second light-emitting layer is green, and the emission color of the third light-emitting layer is blue.

Note that the structure described in this embodiment can be combined as appropriate with any of the structures described in the other embodiments.

(Embodiment 4)

In this embodiment, a light-emitting device which is one embodiment of the present invention will be described.

Figure 8:
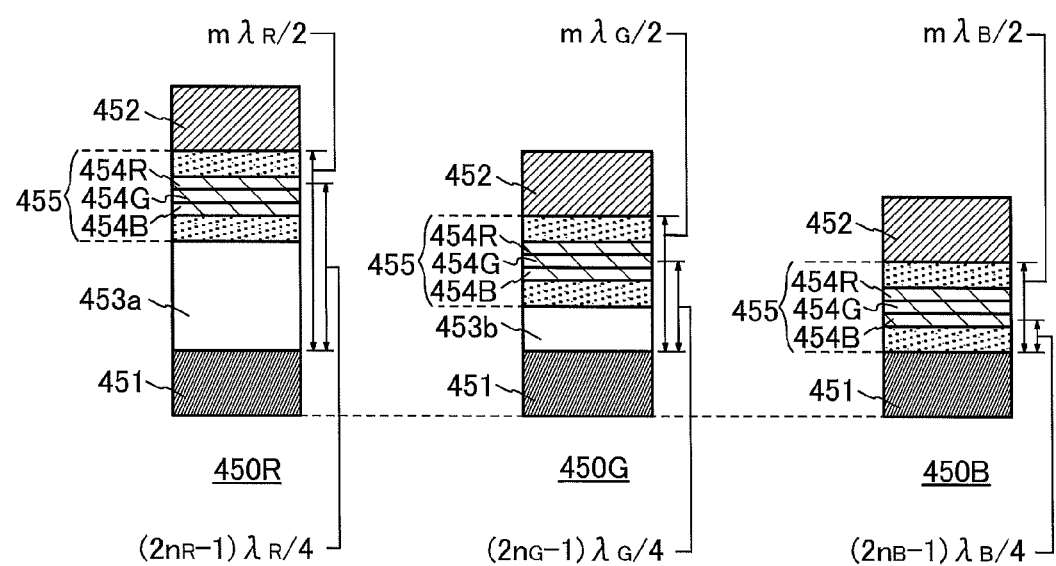
FIG. 8 illustrates structures of light-emitting elements.

A light-emitting device described in this embodiment has a micro optical resonator (microcavity) structure in which a light resonant effect between a pair of electrodes is utilized. The light-emitting device includes, as illustrated in FIG. 8, a plurality of light-emitting elements each of which has at least an EL layer 455 between a pair of electrodes (a reflective electrode 451 and a semi-transmissive and semi-reflective electrode 452). Further, the EL layer 455 includes at least a hole-transport layer (not illustrated) and light-emitting layers 454 (454R, 454G and 454B), and may further include a hole-injection layer, an electron-transport layer, an electron-injection layer, a charge generation layer, and the like.

A first light-emitting element 450R has a structure in which a first transparent conductive layer 453a, an EL layer 455 part of which includes a first light-emitting layer 454B, a second light-emitting layer 454G, and a third light-emitting layer 454R, and the semi-transmissive and semi-reflective electrode 452 are sequentially stacked over the reflective electrode 451. A second light-emitting element 450G has a structure in which a second transparent conductive layer 453b, the EL layer 455, and the semi-transmissive and semi-reflective electrode 452 are sequentially stacked over the reflective electrode 451. A third light-emitting element 450B has a structure in which the EL layer 455 and the semi-transmissive and semi-reflective electrode 452 are sequentially stacked over the reflective electrode 451.

Note that the reflective electrode 451, the EL layer 455, and the semi-transmissive and semi-reflective electrode 452 are common to the light-emitting elements (the first light-emitting element 450R, the second light-emitting element 450G, and the third light-emitting element 450B). The first light-emitting layer 454B emits light ($\lambda_B$) having a peak in a wavelength region from 420 nm to 480 nm. The second light-emitting layer 454G emits light ($\lambda_G$) having a peak in a wavelength region from 500 nm to 550 nm. The third light-emitting layer 454R emits light ($\lambda_R$) having a peak in a wavelength range from 600 nm to 760 nm. Thus, in each of the light-emitting elements (the first light-emitting element 450R, the second light-emitting element 450G and the third light-emitting element 450B), the lights emitted from the first light-emitting layer 454B, the second light-emitting layer 454G, and the third light-emitting layer 454R overlap with each other; accordingly, light having a broad emission spectrum that covers a visible light range can be emitted. Note that the above wavelengths satisfy the relation of $\lambda_B<\lambda_G<\lambda_R$.

Each of the light-emitting elements described in this embodiment has a structure in which the EL layer 455 is interposed between the reflective electrode 451 and the semi-transmissive and semi-reflective electrode 452. The lights emitted in all directions from the light-emitting layers included in the EL layer 455 are resonated by the reflective electrode 451 and the semi-transmissive and semi-reflective electrode 452 which function as a micro optical resonator (microcavity). Note that the reflective electrode 451 is formed using a conductive material having reflectivity, and a film whose visible light reflectivity is 40% to 100%, preferably 70% to 100%, and whose resistivity is $1\times10^{-2}$ Ωcm or lower is used. In addition, the semi-transmissive and semi-reflective electrode 452 is formed using a conductive material having reflectivity and a conductive material having a light-transmitting property, and a film whose visible light reflectivity is 20% to 80%, preferably 40% to 70%, and whose resistivity is $1\times10^{-2}$ Ωcm or lower is used.

In this embodiment, the thicknesses of the transparent conductive layers (the first transparent conductive layer 453a and the second transparent conductive layer 453b) provided in the first light-emitting element 450R and the second light-emitting element 450G, respectively, are varied between the light-emitting elements, whereby the light-emitting elements differ in the optical path length from the reflective electrode 451 to the semi-transmissive and semi-reflective electrode 452. In other words, in light having a broad emission spectrum, which is emitted from the light-emitting layers of each of the light-emitting elements, light with a wavelength that is resonated between the reflective electrode 451 and the semi-transmissive and semi-reflective electrode 452 can be enhanced while light with a wavelength that is not resonated therebetween can be attenuated. Thus, when the elements differ in the optical path length from the reflective electrode 451 to the semi-transmissive and semi-reflective electrode 452, light with different wavelengths can be extracted.

Note that the optical path length (also referred to as optical distance) is expressed as a product of an actual distance and a refractive index. In this embodiment, the optical path length is a product of an actual thickness and n (refractive index); that is, optical path length=actual thickness×n.

Further, the optical path length from the reflective electrode 451 to the semi-transmissive and semi-reflective electrode 452 is set to $m\lambda_R/2$ (m is a natural number of 1 or more) in the first light-emitting element 450R; the optical path length from the reflective electrode 451 to the semi-transmissive and semi-reflective electrode 452 is set to $m\lambda_G/2$ (m is a natural number of 1 or more) in the second light-emitting element 450G; and the optical path length from the reflective electrode 451 to the semi-transmissive and semi-reflective electrode 452 is set to $m\lambda_B/2$ (m is a natural number of 1 or more) in the third light-emitting element 450B.

In this manner, the light ($\lambda_R$) emitted from the third light-emitting layer 454R included in the EL layer 455 is mainly extracted from the first light-emitting element 450R, the light ($\lambda_G$) emitted from the second light-emitting layer 454G included in the EL layer 455 is mainly extracted from the second light-emitting element 450G, and the light ($\lambda_B$) emitted from the first light-emitting layer 454B included in the EL layer 455 is mainly extracted from the third light-emitting element 450B. Note that the light extracted from each of the light-emitting elements is emitted through the semi-transmissive and semi-reflective electrode 452 side.

Further, strictly speaking, the optical path length from the reflective electrode 451 to the semi-transmissive and semi-reflective electrode 452 is the distance from a reflection region in the reflective electrode 451 to a reflection region in the semi-transmissive and semi-reflective electrode 452. However, it is difficult to precisely determine the positions of the reflection regions in the reflective electrode 451 and the semi-transmissive and semi-reflective electrode 452; therefore, it is assumed that the above effect can be sufficiently obtained wherever the reflection regions may be set in the reflective electrode 451 and the semi-transmissive and semi-reflective electrode 452.

Next, the optical path length from the reflective electrode 451 to the third light-emitting layer 454R is adjusted to $(2n_R-1)\lambda_R/4$ ($n_R$ is a natural number of 1 or more) because in the first light-emitting element 450R, light (first reflected light) that is reflected by the reflective electrode 451 of the light emitted from the third light-emitting layer 454R interferes with light (first incident light) that directly enters the semi-transmissive and semi-reflective electrode 452 from the third light-emitting layer 454R. By adjusting the optical path length, the phases of the first reflected light and the first incident light can be aligned with each other and the light emitted from the third light-emitting layer 454R can be amplified.

Note that, strictly speaking, the optical path length from the reflective electrode 451 to the third light-emitting layer 454R can be the optical path length from a reflection region in the reflective electrode 451 to a light-emitting region in the third light-emitting layer 454R. However, it is difficult to precisely determine the positions of the reflection region in the reflective electrode 451 and the light-emitting region in the third light-emitting layer 454R; therefore, it is assumed that the above effect can be sufficiently obtained wherever the reflection region and the light-emitting region may be set in the reflective electrode 451 and the third light-emitting layer 454R, respectively.

Next, the optical path length from the reflective electrode 451 to the second light-emitting layer 454G is adjusted to $(2n_G-1)\lambda_G/4$ ($n_G$ is a natural number of 1 or more) because in the second light-emitting element 450G, light (second reflected light) that is reflected by the reflective electrode 451 of the light emitted from the second light-emitting layer 454G interferes with light (second incident light) that directly enters the semi-transmissive and semi-reflective electrode 452 from the second light-emitting layer 454G. By adjusting the optical path length, the phases of the second reflected light and the second incident light can be aligned with each other and the light emitted from the second light-emitting layer 454G can be amplified.

Note that, strictly speaking, the optical path length from the reflective electrode 451 to the second light-emitting layer 454G can be the optical path length from a reflection region in the reflective electrode 451 to a light-emitting region in the second light-emitting layer 454G. However, it is difficult to precisely determine the positions of the reflection region in the reflective electrode 451 and the light-emitting region in the second light-emitting layer 454G; therefore, it is assumed that the above effect can be sufficiently obtained wherever the reflection region and the light-emitting region may be set in the reflective electrode 451 and the second light-emitting layer 454G, respectively.

Next, the optical path length from the reflective electrode 451 to the first light-emitting layer 454B is adjusted to $(2n_B-1)\lambda_B/4$ ($n_B$ is a natural number of 1 or more) because in the third light-emitting element 450B, light (third reflected light) that is reflected by the reflective electrode 451 of the light emitted from the first light-emitting layer 454B interferes with light (third incident light) that directly enters the semi-transmissive and semi-reflective electrode 452 from the first light-emitting layer 454B. By adjusting the optical path length, the phases of the third reflected light and the third incident light can be aligned with each other and the light emitted from the first light-emitting layer 454B can be amplified.

Note that, strictly speaking, the optical path length from the reflective electrode 451 to the first light-emitting layer 454B can be the optical path length from a reflection region in the reflective electrode 451 to a light-emitting region in the first light-emitting layer 454B. However, it is difficult to precisely determine the positions of the reflection region in the reflective electrode 451 and the light-emitting region in the first light-emitting layer 454B; therefore, it is assumed that the above effect can be sufficiently obtained wherever the reflection region and the light-emitting region may be set in the reflective electrode 451 and the first light-emitting layer 454B, respectively.

Note that although each of the light-emitting elements in the above-described structures includes a plurality of light-emitting layers in the EL layer, the present invention is not limited thereto; for example, the structure of the tandem (stacked-type) light-emitting element which is described in Embodiment 3 can be combined, in which case a plurality of light-emitting layers are provided so that a charge generation layer is interposed therebetween in one light-emitting element.

The light-emitting device described in this embodiment has a microcavity structure, in which light with wavelengths which vary depending on the light-emitting elements can be extracted even when they include EL layers with the same structure, so that it is not necessary to form light-emitting elements for the colors of R, and B. Therefore, the above structure is advantageous for full color display owing to easiness in achieving higher resolution display or the like. In addition, emission intensity with a predetermined wavelength in the front direction can be increased, whereby power consumption can be reduced. The above structure is particularly useful in the case of being applied to a color display (image display device) including pixels of three or more colors but may also be applied to lighting or the like.

Note that the structure described in this embodiment can be combined as appropriate with any of the structures described in the other embodiments.

(Embodiment 5)

In this embodiment, a light-emitting device including a light-emitting element which is one embodiment of the present invention will be described.

The light-emitting device can be either a passive matrix light-emitting device or an active matrix light-emitting device. Note that any of the light-emitting elements described in the other embodiments can be applied to the light-emitting device described in this embodiment.

In this embodiment, an active matrix light-emitting device is described with reference to FIGS. 9A and 9B.

Figure 9A:
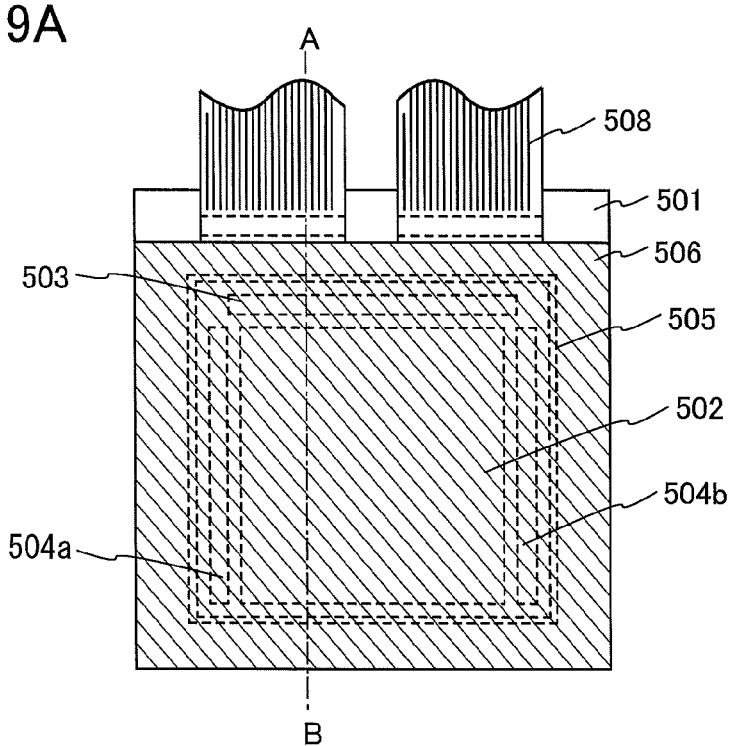
FIGS. 9A and 9B illustrate a light emitting device.
Figure 9B:
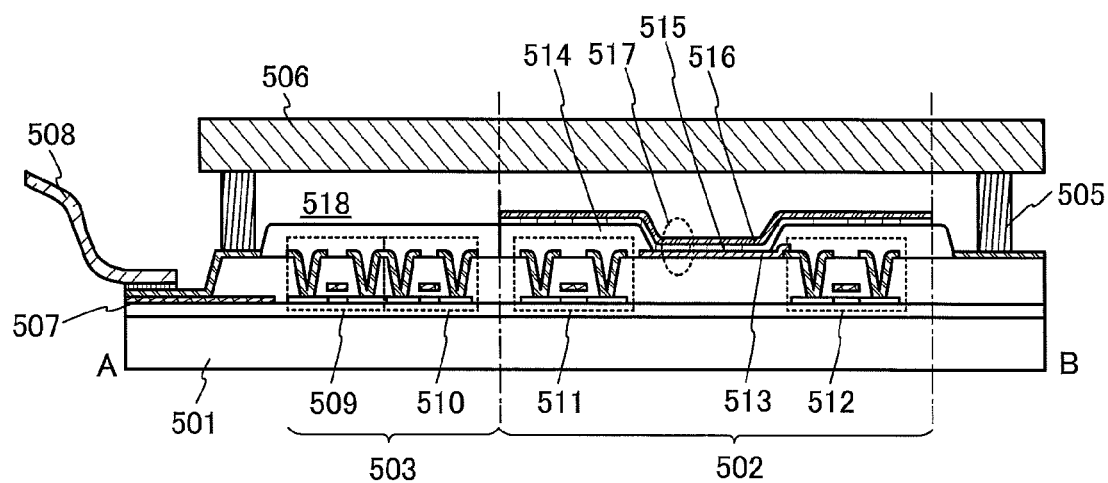

FIG. 9A is a top view illustrating a light-emitting device and FIG. 9B is a cross-sectional view taken along dashed line A-B in FIG. 9A. The active matrix light-emitting device of this embodiment includes a pixel portion 502 provided over an element substrate 501, a driver circuit portion (a source line driver circuit) 503, and driver circuit portions (gate line driver circuits) 504 (504a and 504b). The pixel portion 502, the driver circuit portion 503, and the driver circuit portion 504 are sealed with a sealant 505 between the element substrate 501 and a sealing substrate 506.

In addition, over the element substrate 501, a lead wiring 507 for connecting an external input terminal, through which a signal (e.g., a video signal, a clock signal, a start signal, a reset signal, or the like) or electric potential from the outside is transmitted to the driver circuit portion 503 and the driver circuit portion 504, is provided. Here, an example is described in which a flexible printed circuit (FPC) 508 is provided as the external input terminal. Although only the FPC is illustrated here, a printed wiring board (PWB) may be attached to the FPC. The light-emitting device in this specification includes, in its category, not only the light-emitting device itself but also the light-emitting device provided with the FPC or the PWB.

Next, a cross-sectional structure will be described with reference to FIG. 9B. The driver circuit portion and the pixel portion are formed over the element substrate 501; here are illustrated the driver circuit portion 503 which is the source line driver circuit and the pixel portion 502.

An example is illustrated in which a CMOS circuit which is a combination of an n-channel TFT 509 and a p-channel TFT 510 is formed as the driver circuit portion 503. Note that a circuit included in the driver circuit portion may be formed using any of various circuits, such as a CMOS circuit, a PMOS circuit, or an NMOS circuit. In this embodiment, although a driver-integrated type structure in which a driver circuit is formed over a substrate is described, a driver circuit is not necessarily formed over a substrate but can be formed outside a substrate.

The pixel portion 502 is formed of a plurality of pixels each of which includes a switching TFT 511, a current control TFT 512, and a first electrode 513 which is electrically connected to a wiring (a source electrode or a drain electrode) of the current control TFT 512. An insulator 514 is formed so as to cover an edge portion of the first electrode 513. In this embodiment, the insulator 514 is formed using a positive photosensitive acrylic resin. Note that the first electrode 513 is used as an anode in this embodiment.

In addition, in order to obtain favorable coverage by a film which is to be stacked over the insulator 514, the insulator 514 is preferably formed so as to have a curved surface with curvature at an upper edge portion or a lower edge portion. For example, in the case of using a positive photosensitive acrylic resin as a material for the insulator 514, the insulator 514 is preferably formed so as to have a curved surface with a curvature radius (0.2 μm to 3 μm) at the upper edge portion. The insulator 514 can be formed using either a negative photosensitive resin or a positive photosensitive resin. It is possible to use, without limitation to an organic compound, either an organic compound or an inorganic compound such as silicon oxide or silicon oxynitride.

An EL layer 515 and a second electrode 516 are stacked over the first electrode 513. In the EL layer 515, at least a hole-transport layer and a light-emitting layer are provided. The structure described in Embodiment 1 or 2 can be employed for the hole-transport layer and the light-emitting layer. Note that the second electrode 516 is used as a cathode in this embodiment.

A light-emitting element 517 is formed of a stacked structure of the first electrode 513, the EL layer 515, and the second electrode 516. For each of the first electrode 513, the EL layer 515, and the second electrode 516, any of the materials described in Embodiment 2 can be used. Although not illustrated, the second electrode 516 is electrically connected to an FPC 508 which is an external input terminal.

Although the cross-sectional view of FIG. 9B illustrates only one light-emitting element 517, a plurality of light-emitting elements are arranged in matrix in the pixel portion 502. Light-emitting elements that emit light of three kinds of colors (R, G, and B) are selectively formed in the pixel portion 502, whereby a light-emitting device capable of full color display can be obtained. Alternatively, a light-emitting device which is capable of full color display may be manufactured by a combination with color filters.

Further, the sealing substrate 506 is attached to the element substrate 501 with the sealant 505, whereby a light-emitting element 517 is provided in a space 518 surrounded by the element substrate 501, the sealing substrate 506, and the sealant 505. Note that the space 518 may be filled with an inert gas (such as nitrogen and argon) or the sealant 505.

An epoxy-based resin is preferably used for the sealant 505. Such a material preferably allows as little moisture and oxygen as possible to penetrate. As the sealing substrate 506, a plastic substrate formed of fiberglass-reinforced plastics (FRP), polyvinyl fluoride (PVF), polyester, acrylic, or the like can be used besides a glass substrate or a quartz substrate.

As described above, an active matrix light-emitting device can be obtained.

Note that the structure described in this embodiment can be combined as appropriate with any of the structures described in the other embodiments.

(Embodiment 6)

In this embodiment, electronic appliances each of which includes the light-emitting device of one embodiment of the present invention described in the above embodiment will be described. Examples of the electronic appliance include cameras such as video cameras and digital cameras, goggle type displays, navigation systems, audio replay devices (e.g., car audio systems and audio systems), computers, game machines, portable information terminals (e.g., mobile computers, mobile phones, smartphones, portable game machines, e-book readers, and tablet terminals), and image replay devices in which a recording medium is provided (specifically, devices that are capable of replaying recording media such as digital versatile discs (DVDs) and equipped with a display device that can display an image). Specific examples of these electronic appliances will be described with reference to FIGS. 10 to 10D and FIGS. 11A to 11D.

Figure 10A:
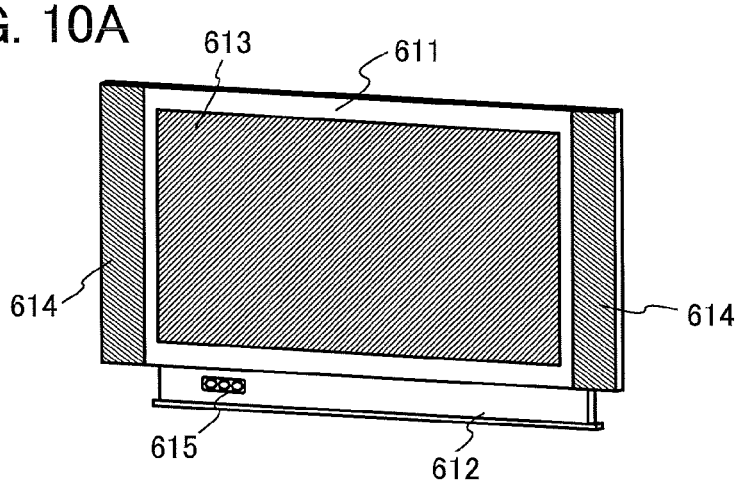
FIGS. 10A to 10D illustrate electronic appliances.

FIG. 10A illustrates a television set of one embodiment of the present invention, which includes a housing 611, a supporting base 612, a display portion 613, speaker portions 614, video input terminals 615, and the like. In this television set, the light-emitting device of one embodiment of the present invention can be applied to the display portion 613. Since the light-emitting device of one embodiment of the present invention is driven at a low voltage and has high current efficiency, by the application of the light-emitting device of one embodiment of the present invention, a television set with reduced power consumption can be obtained.

Figure 10B:
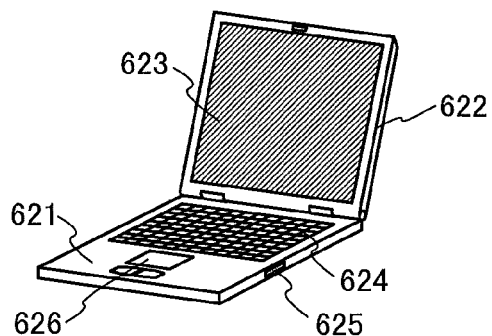

FIG. 10B illustrates a computer of one embodiment of the present invention, which includes a main body 621, a housing 622, a display portion 623, a keyboard 624, an external connection port 625, a pointing device 626, and the like. In this computer, the light-emitting device of one embodiment of the present invention can be applied to the display portion 623. Since the light-emitting device of one embodiment of the present invention is driven at a low voltage and has high current efficiency, by the application of the light-emitting device of one embodiment of the present invention, a computer with reduced power consumption can be obtained.

Figure 10C:
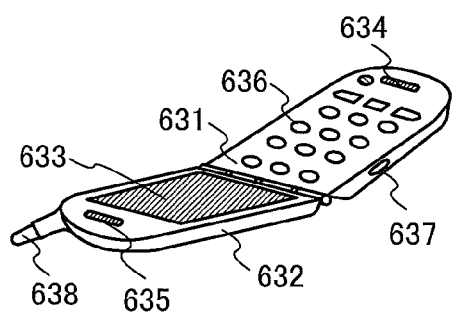

FIG. 10C illustrates a mobile phone of one embodiment of the present invention, which includes a main body 631, a housing 632, a display portion 633, an audio input portion 634, an audio output portion 635, operation keys 636, an external connection port 637, an antenna 638, and the like. In this mobile phone, the light-emitting device of one embodiment of the present invention can be applied to the display portion 633. Since the light-emitting device of one embodiment of the present invention is driven at a low voltage and has high current efficiency, by the application of the light-emitting device of one embodiment of the present invention, a mobile phone with reduced power consumption can be obtained.

Figure 10D:
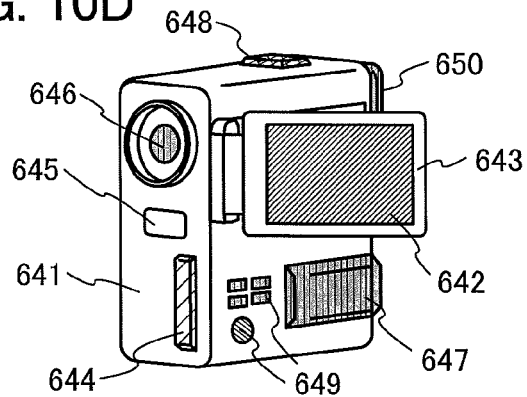

FIG. 10D illustrates a camera of one embodiment of the present invention, which includes a main body 641, a display portion 642, a housing 643, an external connection port 644, a remote control receiving portion 645, an image receiving portion 646, a battery 647, an audio input portion 648, operation keys 649, an eyepiece portion 650, and the like. In this camera, the light-emitting device of one embodiment of the present invention can be applied to the display portion 642.

Since the light-emitting device of one embodiment of the present invention is driven at a low voltage and has high current efficiency, by the application of the light-emitting device of one embodiment of the present invention, a camera with reduced power consumption can be obtained.

Figures 11A, 11B, 11C:
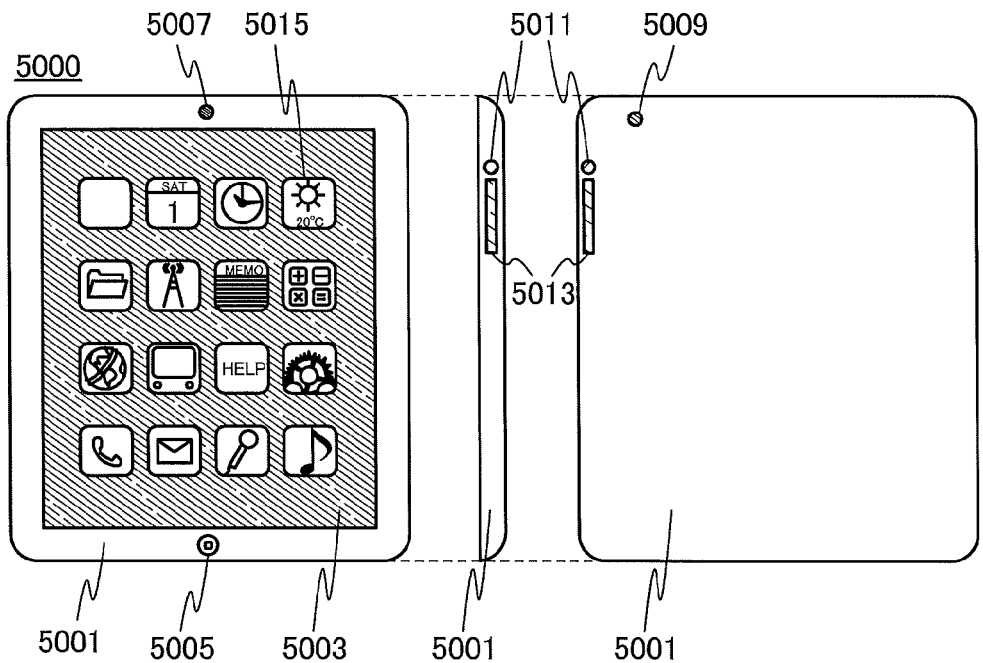
FIGS. 11A to 11D illustrate electronic appliances.
Figure 11D:
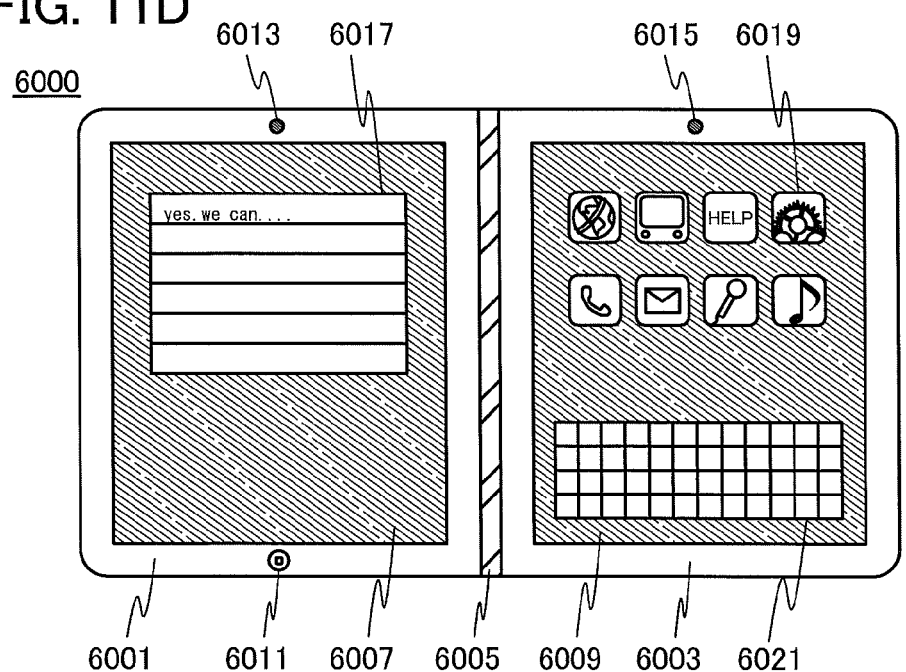

FIGS. 11A to 11D illustrate examples of portable terminals of one embodiment of the present invention. FIGS. 11A to 11C illustrate a portable terminal 5000, and FIG. 11D illustrates a portable terminal 6000.

FIGS. 11A, 11B, and 11C are a front view, a side view, and a rear view of the portable terminal 5000, respectively. FIG. 11D is a front view of the portable terminal 6000.

The portable terminal 5000 includes a housing 5001, a display portion 5003, a power button 5005, a front camera 5007, a rear camera 5009, a first external connection terminal 5011, a second external connection terminal 5013, and the like.

In addition, the display portion 5003 is incorporated in the housing 5001 and can be used as a touch panel. For example, e-mailing or schedule management can be performed by touching an icon 5015 and the like on the display portion 5003. Further, the front camera 5007 is incorporated on the front side of the housing 5001, whereby an image on the user's side can be taken. The rear camera 5009 is incorporated in the rear side of the housing 5001, whereby an image on the opposite side of the user can be taken. Further, the housing 5001 includes the first external connection terminal 5011 and the second external connection terminal 5013. Sound can be output to an earphone or the like through the first external connection terminal 5011, and data can be moved through the second external connection terminal 5013, for example.

The portable terminal 6000 in FIG. 11D includes a first housing 6001, a second housing 6003, a hinge portion 6005, a first display portion 6007, a second display portion 6009, a power button 6011, a first camera 6013, a second camera 6015, and the like.

The first display portion 6007 is incorporated in the first housing 6001. The second display portion 6009 is incorporated in the second housing 6003. For example, the first display portion 6007 and the second display portion 6009 are used as a display panel and a touch panel, respectively. A user can select images, enter characters, and so on by touching an icon 6019 displayed on the second display portion 6009 or a keyboard 6021 (actually, a keyboard image displayed on the second display portion 6009) while looking at a text icon 6017 displayed on the first display portion 6007. Alternatively, the first display portion 6007 and the second display portion 6009 may be a touch panel and a display panel, respectively, or the first display portion 6007 and the second display portion 6009 may be touch panels.

The first housing 6001 and the second housing 6003 are connected to each other and open and close on the hinge portion 6005. In such a structure, the first display portion 6007 incorporated in the first housing 6001 and the second display portion 6009 incorporated in the second housing 6003 are preferably made to face each other in carrying the portable terminal 6000, in which case the surfaces of the first display portion 6007 and the second display portion 6009 (e.g., plastic substrates) can be protected.

Alternatively, the first housing 6001 and the second housing 6003 may be separated by the hinge portion 6005 (what is called convertible type). Thus, the application range of the portable terminal 6000 can be extended, and for example, the first housing 6001 is used in a vertical orientation and the second housing 6003 is used in a horizontal orientation.

Further, the first camera 6013 and the second camera 6015 can take 3D images.

The portable terminal 5000 and the portable terminal 6000 may send and receive data wirelessly. For example, through wireless internet connection, desired data can be purchased and downloaded.

The portable terminal 5000 and the portable terminal 6000 can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs). A detector such as a photodetector capable of optimizing display luminance in accordance with the amount of outside light or a sensor for detecting inclination, like a gyroscope or an acceleration sensor, may be included.

The light-emitting device of one embodiment of the present invention can be applied to the display portion 5003 of the portable terminal 5000 and the first display portion 6007 of the potable terminal 6000 and/or the second display portion 6009 of the portable terminal 6000. Since the light-emitting device of one embodiment of the present invention is driven at low voltage and has high current efficiency, by the application of the light-emitting device of one embodiment of the present invention, a portable terminal with reduced power consumption can be obtained.

As described above, the applicable range of the light-emitting device of one embodiment of the present invention is so wide that the light-emitting device can be applied to electronic appliances in a variety of fields. With the use of the light-emitting device of one embodiment of the present invention, an electronic appliance with reduced power consumption can be obtained.

The light-emitting device of one embodiment of the present invention can also be used as a lighting device. Specific examples of the lighting device are described with reference to FIGS. 12A to 12C.

Figure 12A:
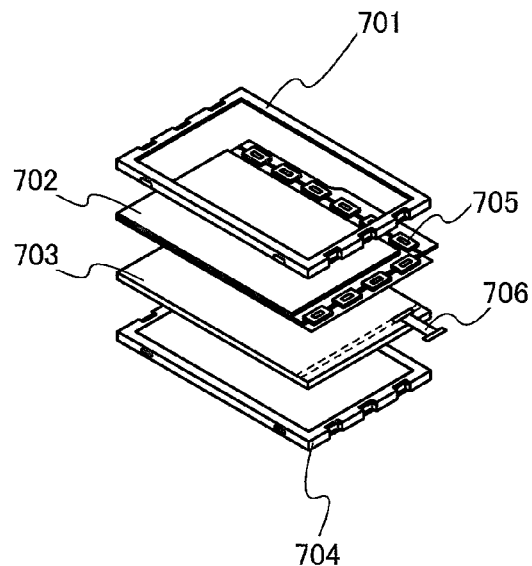
FIGS. 12A to 12C illustrate lighting devices.

FIG. 12A illustrates an example of a liquid crystal display device using the light-emitting device of one embodiment of the present invention as a backlight. The liquid crystal display device illustrated in FIG. 12A includes a housing 701, a liquid crystal panel 702, a backlight 703, and a housing 704. The liquid crystal panel 702 is connected to a driver IC 705. The light-emitting device of one embodiment of the present invention is used as the backlight 703, and current is supplied through a terminal 706. By using the light-emitting device of one embodiment of the present invention as a backlight of a liquid crystal display device as described above, a backlight having low power consumption can be obtained. Moreover, since the light-emitting device of one embodiment of the present invention is a lighting device for surface light emission and the enlargement of the light-emitting device is possible, the backlight can be made larger. Thus, a larger-area liquid crystal display device with low power consumption can be obtained.

Figure 12B:
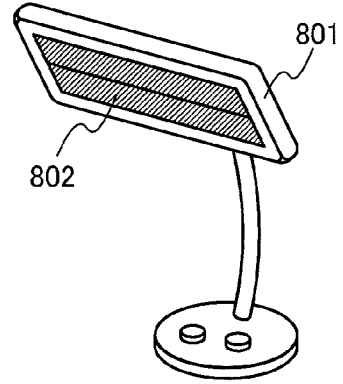

FIG. 12B illustrates an example in which the light-emitting device of one embodiment of the present invention is used for a desk lamp which is a lighting device.

The desk lamp illustrated in FIG. 12B has a housing 801 and a light source 802, and the light-emitting device of one embodiment of the present invention is used as the light source 802. Since the light-emitting device of one embodiment of the present invention is driven at a low voltage and has high current efficiency, by the application of the light-emitting device of one embodiment of the present invention, a desk lamp with reduced power consumption can be obtained.

Figure 12C:
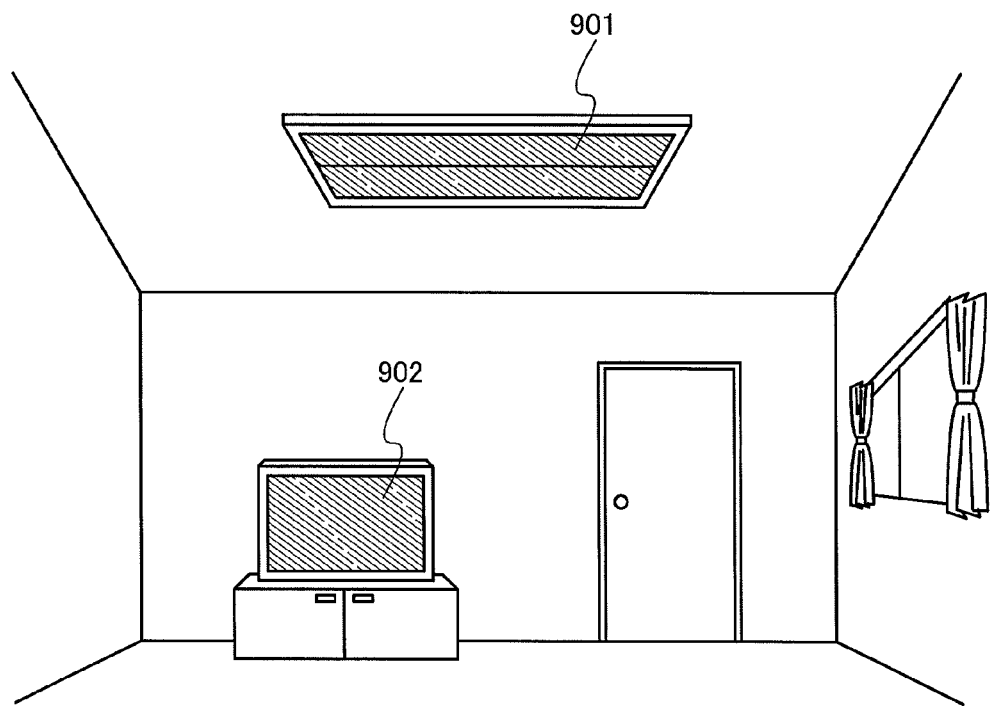

FIG. 12C illustrates an example in which the light-emitting device of one embodiment of the present invention is used for an indoor lighting device 901. Since the light-emitting device of one embodiment of the present invention can also have a larger area, the light-emitting device of one embodiment of the present invention can be used as a lighting device having a large area. Since the light-emitting device of one embodiment of the present invention is driven at a low voltage and has high current efficiency, by the application of the light-emitting device of one embodiment of the present invention, a lighting device with reduced power consumption can be obtained. In a room where the light-emitting device of one embodiment of the present invention is used for the indoor lighting device 901 as described above, a television set 902 of one embodiment of the present invention described with reference to FIG. 10A can be installed so that public broadcasting and movies can be watched.

Note that this embodiment can be freely combined with any of the other embodiments as appropriate.

Example 1

Figure 13:
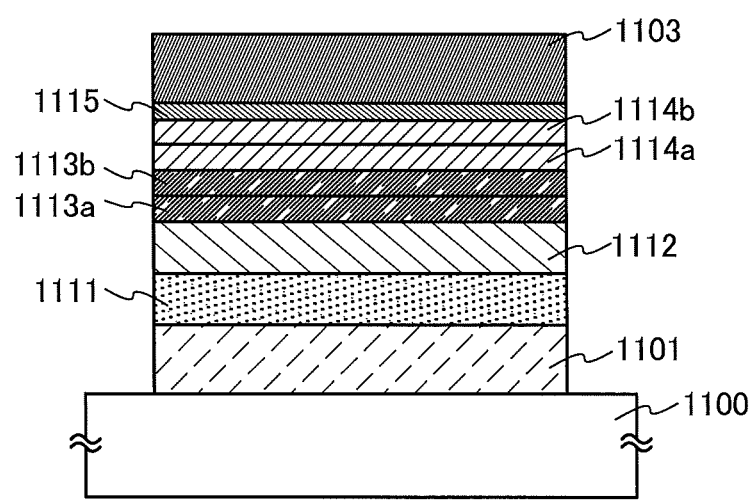
FIG. 13 illustrates a structure of a light-emitting element in Examples.

In this example, a light-emitting element of one embodiment of the present invention (a light-emitting element 1) and a light-emitting element for comparison (a comparative light-emitting element 2) will be described with reference to FIG. 13. Chemical formulae of materials used in this example are shown below.

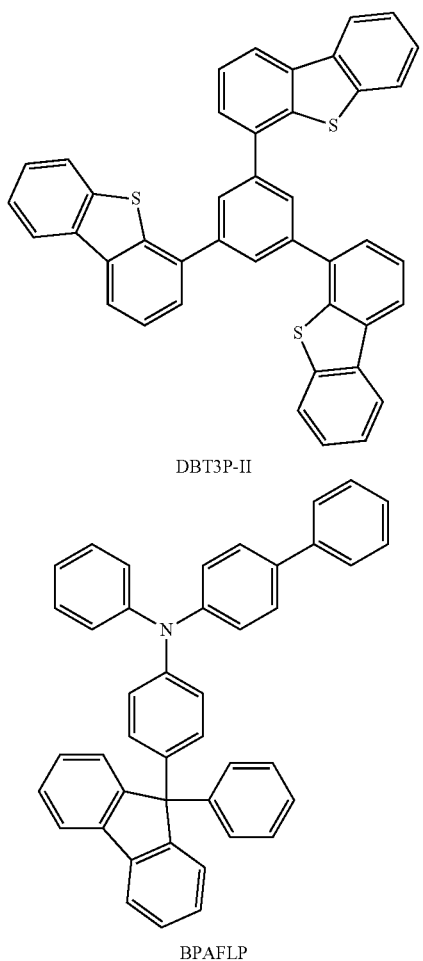

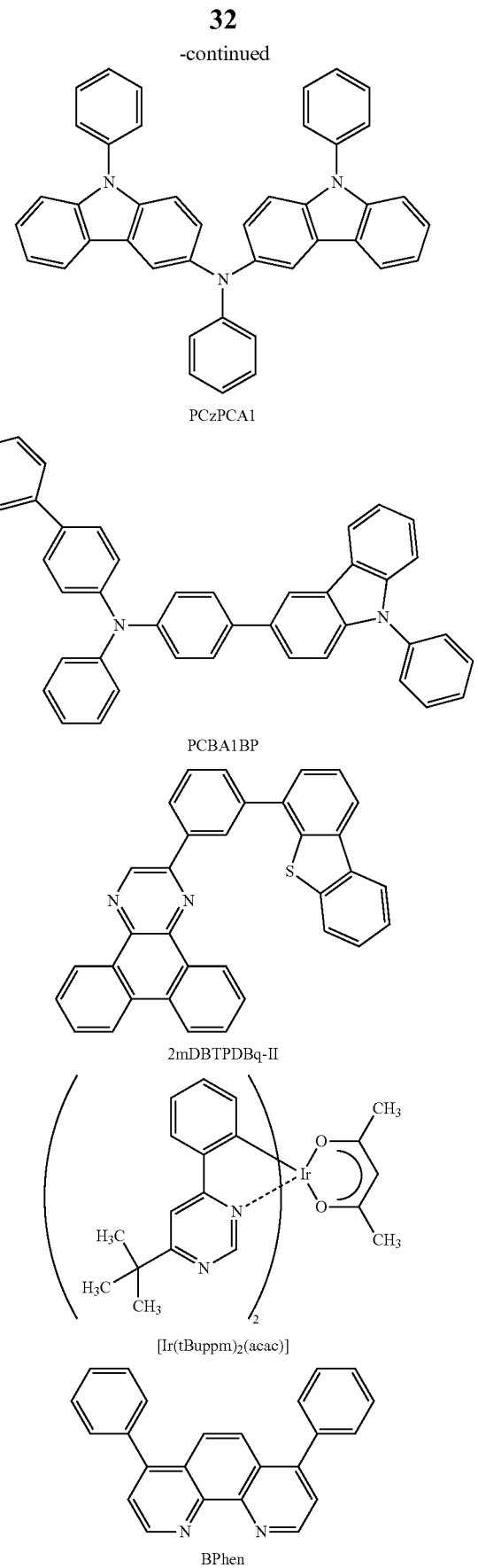

Manufacturing methods of the light-emitting element 1 and the comparative light-emitting element 2 will be described below.

(Light-Emitting Element 1)

First, over a substrate 1100, an indium oxide-tin oxide compound containing silicon or silicon oxide (ITO—$SiO_2$, hereinafter abbreviated to ITSO) was deposited by a sputtering method, whereby a first electrode 1101 was formed. Note that the composition ratio of $In_2O_3$ to $SnO_2$ and $SiO_2$ in the target used was 85:10:5 [wt %]. The thickness of the first electrode 1101 was set to 110 nm and the electrode area was 2 mm×2 mm. Here, the first electrode 1101 is an electrode which functions as an anode of the light-emitting element.

Next, as pretreatment for forming the light-emitting element over the substrate 1100, the surface of the substrate was washed with water, baked at 200° C. for one hour, and subjected to UV ozone treatment for 370 seconds.

After that, the substrate 1100 was transferred into a vacuum evaporation apparatus where the pressure had been reduced to approximately $10^{-4}$ Pa, and subjected to vacuum baking at 170° C. for 30 minutes in a heating chamber of the vacuum evaporation apparatus, and then the substrate 1100 was cooled down for about 30 minutes.

Then, the substrate 1100 over which the first electrode 1101 was foiled was fixed to a substrate holder provided in a vacuum evaporation apparatus so that the surface on which the first electrode 1101 was formed faced downward. The pressure in the vacuum evaporation apparatus was reduced to about $10^{-4}$ Pa. After that, on the first electrode 1101, by an evaporation method using resistance heating, 4,4',4''-(benzene-1,3,5-triyl)tri(dibenzothiophene) (abbreviation: DBT3P-II) and molybdenum oxide were deposited by co-evaporation, whereby a hole-injection layer 1111 was formed. The thickness of the hole-injection layer 1111 was set to 40 nm, and the weight ratio of DBT3P-II (abbreviation) to molybdenum oxide was adjusted to 4:2(=DBT3P-II:molybdenum oxide).

Next, 4-phenyl-4'-(9-phenylfluoren-9-yl)triphenylamine (abbreviation: BPAFLP) and 3-[N-(9-phenylcarbazol-3-yl)-N-phenylamino]-9-phenylcarbazole (abbreviation: PCzPCA1) were deposited on the hole-injection layer 1111 by co-evaporation, whereby a hole-transport layer 1112 was formed. The thickness of the hole-transport layer 1112 was set to 20 nm. The weight ratio of BPAFLP (abbreviation) to PCzPCA1 (abbreviation) was adjusted to 0.5 to 0.5 (=BPAFLP:PCzPCA1).

Note that in the hole-transport layer 1112, BPAFLP (abbreviation) is a fourth organic compound and PCzPCA1 (abbreviation) is a fifth organic compound.

Next, 2mDBTPDBq-II (abbreviation), 4-phenyl-4'-(9-phenyl-9H-carbazol-3-yl)triphenylamine (abbreviation: PCBA1BP), and (acetylacetonato)bis(6-tert-butyl-4-phenylpyrimidinato)iridium(III) (abbreviation: [Ir(tBuppm)$_2$(acac)]) were deposited on the hole-transport layer 1112 by co-evaporation, whereby a first light-emitting layer 1113a was formed. Here, the weight ratio of 2mDBTPDBq-II (abbreviation) to PCBA1BP (abbreviation) and [Ir(tBuppm)$_2$(acac)] (abbreviation) was adjusted to 0.8:0.2:0.06 (=2mDBTPDBq-II:PCBA1BP:[Ir(tBuppm)$_2$(acac)]). The thickness of the first light-emitting layer 1113a was set to 20 nm.

Note that in the first light-emitting layer 1113a, 2mDBTPDBq-II (abbreviation) is a first organic compound (host material), PCBA1BP (abbreviation) is a second organic compound (assist material), and [Ir(tBuppm)$_2$(acac)] is a third organic compound (guest material).

Next, 2mDBTPDBq-II (abbreviation), PCBA1BP (abbreviation), and [Ir(tBuppm)$_2$(acac)] (abbreviation) were deposited on the first light-emitting layer 1113a by co-evaporation, whereby a second light-emitting layer 1113b was formed. Here, the weight ratio of 2mDBTPDBq-II (abbreviation) to PCBA1BP (abbreviation) and [Ir(tBuppm)$_2$(acac)] (abbreviation) was adjusted to 0.8:0.2:0.05 (=2mDBTPDBq-II:PCBA1BP:[Ir(tBuppm)$_2$(acac)]). The thickness of the second light-emitting layer 1113b was set to 20 nm.

Note that in the second light-emitting layer 1113b, 2mDBTPDBq-II (abbreviation) is a first organic compound (host material), PCBA1BP (abbreviation) is a second organic compound (assist material), and [Ir(tBuppm)$_2$(acac)] (abbreviation) is a third organic compound (guest material).

Next, on the second light-emitting layer 1113b, 2mDBTPDBq-II (abbreviation) was deposited to a thickness of 10 nm, whereby a first electron-transport layer 1114a was formed.

After that, on the first electron-transport layer 1114a, a bathophenanthroline (abbreviation: BPhen) was deposited to a thickness of 20 nm, whereby a second electron-transport layer 1114b was formed.

Next, lithium fluoride (LiF) was deposited to a thickness of 1 nm on the second electron-transport layer 1114b by evaporation, whereby an electron-injection layer 1115 was formed.

Lastly, aluminum (Al) was deposited to a thickness of 200 nm by evaporation as a second electrode 1103 which functions as a cathode. Thus, the light-emitting element 1 of this example was manufactured.

Note that, in all the above evaporation steps, evaporation was performed by a resistance-heating method.

(Comparative Light-Emitting Element 2)

The structure of the comparative light-emitting element 2 is the same as that of the light-emitting element 1 except for a structure of the hole-transport layer 1112. Only the different structure will be described below.

On the hole-injection layer 1111, BPAFLP (abbreviation) was deposited by evaporation, whereby the hole-transport layer 1112 was formed. The thickness of the hole-transport layer 1112 was set to 20 nm.

Table 1 shows element structures of the light-emitting element 1 and the comparative light-emitting element 2 obtained as described above.

TABLE 1

| | First electrode | Hole-injection layer | Hole-transport layer | First light-emitting layer | Second light-emitting layer | First electron-transport layer | Second electron-transport layer | Electron-injection layer | Second electrode |
|---|---|---|---|---|---|---|---|---|---|
| Light-emitting element 1 | ITSO 110 nm | DBT3P-II: MoOx (=4:2) 40 nm | BPAFLP: PCzPCA1 (0.5:0.5) 20 nm | 2mDBTPDBq-II: PCBA1BP: Ir(tBuppm)$_2$(acac) (=0.8:0.2:0.06) 20 nm | 2mDBTPDBq-II: PCBA1BP: Ir(tBuppm)$_2$(acac) (=0.8:0.2:0.05) 20 nm | 2mDBTPDBq-II 10 nm | BPhen 20 nm | LiF 1 nm | Al 200 nm |

TABLE 1-continued

| | First electrode | Hole-injection layer | Hole-transport layer | First light-emitting layer | Second light-emitting layer | First electron-transport layer | Second electron-transport layer | Electron-injection layer | Second electrode |
|---|---|---|---|---|---|---|---|---|---|
| Comparative light-emitting element 2 | ITSO 110 nm | DBT3P-II: MoOx (=4:2) 40 nm | BPAFLP 20 nm | 2mDBTPDBq-II: PCBA1BP: Ir(tBuppm)₂(acac) (=0.8:0.2:0.06) 20 nm | 2mDBTPDBq-II: PCBA1BP: Ir(tBuppm)₂(acac) (=0.8:0.2:0.05) 20 nm | 2mDBTPDBq-II 10 nm | BPhen 20 nm | LiF 1 nm | Al 200 nm |

Next, electrochemical characteristics (HOMO levels and LUMO levels) of thin films of BPAFLP (abbreviation) and PCzPCA1 (abbreviation) which were used in the hole-transport layers of the light-emitting element 1 and the comparative light-emitting element 2 in this example, and a thin film of PCBA1BP (abbreviation) which was used in the first light-emitting layer and the second light-emitting layer of the light-emitting element 1 and the comparative light-emitting element 2 in this example (measurement instrument: AC-2, produced by Riken Keiki Co., Ltd) were measured. Note that the electrochemical characteristics of the thin films were measured as described below.

The value of the HOMO level was obtained by conversion of a value of the ionization potential measured with a photoelectron spectrometer (AC-2, manufactured by Riken Keiki Co., Ltd.) in the air into a negative value. The value of the LUMO level was obtained in such a manner that data on the absorption spectrum of each film was measured and the absorption edge, which was obtained from Tauc plot with an assumption of direct transition using the data on the absorption spectrum, was regarded as an optical energy gap and added to the value of the HOMO level.

Table 2 shows measurement results of the electrochemical characteristics of the thin films.

TABLE 2

| | [eV] | | |
|---|---|---|---|
| | HOMO level | LUMO level | Bg(ΔE) |
| BPAFLP | −5.63 | −2.29 | 3.34 |
| PCzPCA1 | −5.17 | −2.26 | 2.91 |
| PCBA1BP | −5.42 | −2.21 | 3.21 |

According to Table 2, the HOMO level, LUMO level, and band gap (Bg) of BPAFLP (abbreviation) were −5.63 eV, −2.29 eV, and 3.34 eV, respectively, the HOMO level, LUMO level, and band gap (Bg) of PCzPCA1 (abbreviation) were −5.17 eV, −2.26 eV, and 2.91 eV, respectively, and the HOMO level, LUMO level, and band gap (Bg) of PCBA1BP (abbreviation) were −5.42 eV, −2.21 eV, and 3.21 eV, respectively.

Table 3 shows the materials and HOMO levels of the hole-transport layer and the light-emitting layer (second organic compound) of the light-emitting element 1 and the comparative light-emitting element 2 in this example according to Table 1 and Table 2.

TABLE 3

| | Name of compound/ HOMO level | Hole-transport layer | | Light-emitting layer (Second organic compound) |
|---|---|---|---|---|
| Light-emitting element 1 | Name of compound (abbreviation) | BPAFLP | PCzPCA1 | PCBA1BP |
| | HOMO level [eV] | −5.63 | −5.17 | −5.42 |
| Comparative light-emitting element 2 | Name of compound (abbreviation) | BPAFLP | — | PCBA1BP |
| | HOMO level [eV] | −5.63 | — | −5.42 |

As shown in Table 3, in the hole-transport layer of the light-emitting element 1 of this example, BPAFLP (abbreviation) was used as the fourth organic compound having a HOMO level which is lower than or equal to that of PCBA1BP (abbreviation) which is the second organic compound (assist material), and PCzPCA1 (abbreviation) was used as the fifth organic compound whose HOMO level is higher than that of PCBA1BP (abbreviation) which is the second organic compound (assist material). In contrast, in the comparative light-emitting element 2, one kind of organic compound (BPAFLP (abbreviation)) having a HOMO level which is lower than or equal to that of PCBA1BP (abbreviation) which is the second organic compound (assist material) was used.

In a glove box containing a nitrogen atmosphere, the light-emitting element 1 and the comparative light-emitting element 2 were each sealed with a glass substrate so as not to be exposed to the air (specifically, a sealant was applied onto an outer edge of the element and heat treatment was performed at 80° C. for 1 hour at the time of sealing). Then, the operating characteristics of the light-emitting elements were measured. Note that the measurement was carried out at room temperature (in an atmosphere kept at 25° C.).

Figure 14:
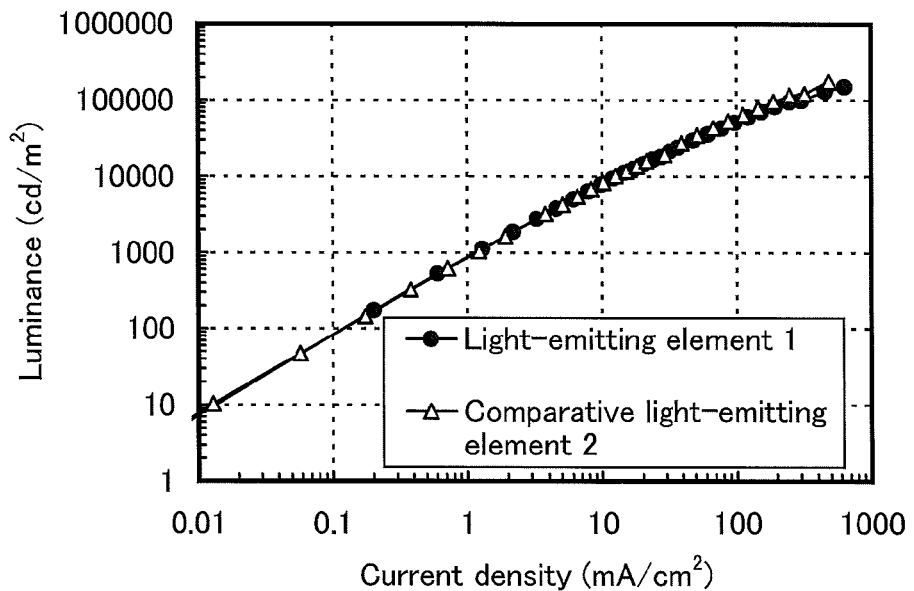
FIG. 14 shows luminance versus current density characteristics of light-emitting elements described in Example 1.
Figure 15:
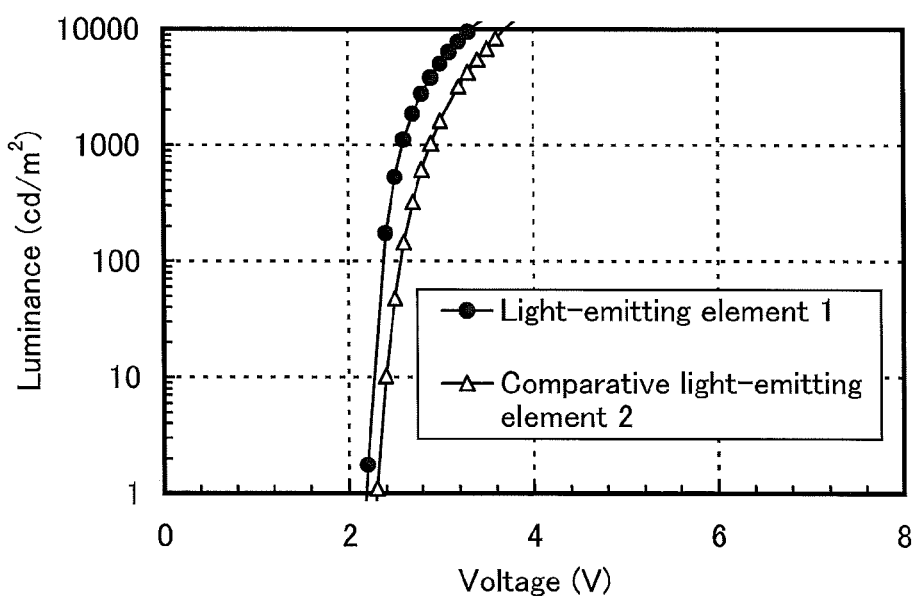
FIG. 15 shows luminance versus voltage characteristics of the light-emitting elements described in Example 1.
Figure 16:
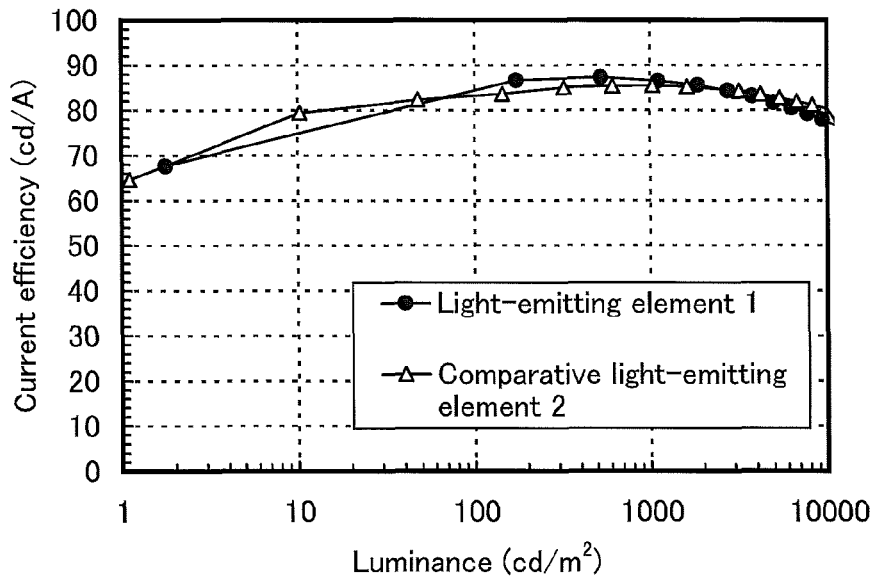
FIG. 16 shows current efficiency versus luminance characteristics of the light-emitting elements described in Example 1.
Figure 17:
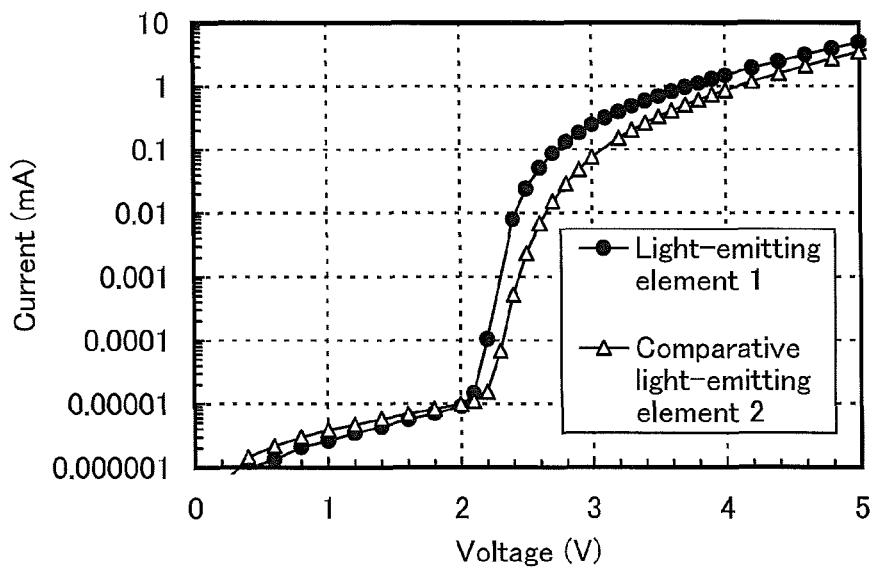
FIG. 17 shows current versus voltage characteristics of the light-emitting elements described in Example 1.
Figure 18:
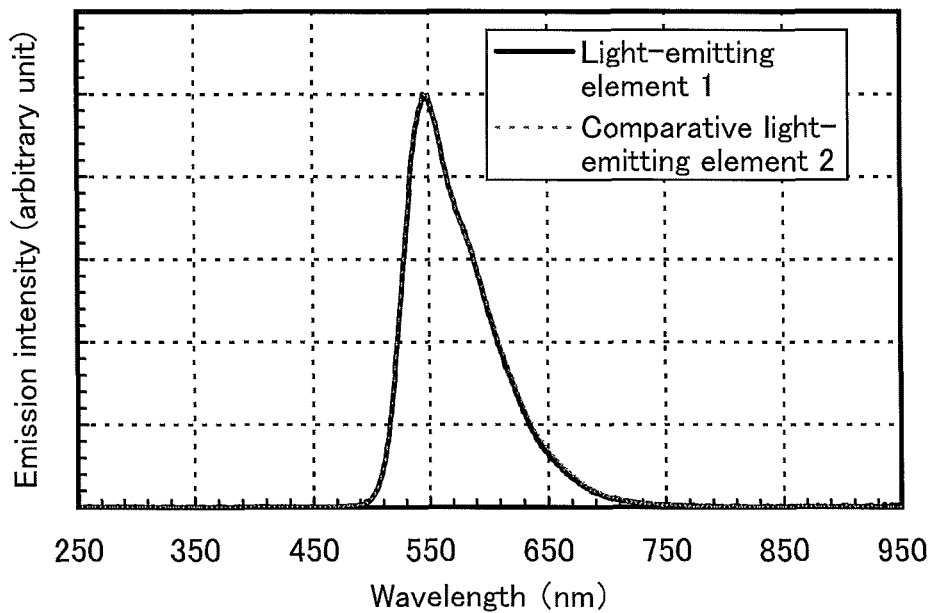
FIG. 18 shows emission spectra of the light-emitting elements described in Example 1.
Figure 19:
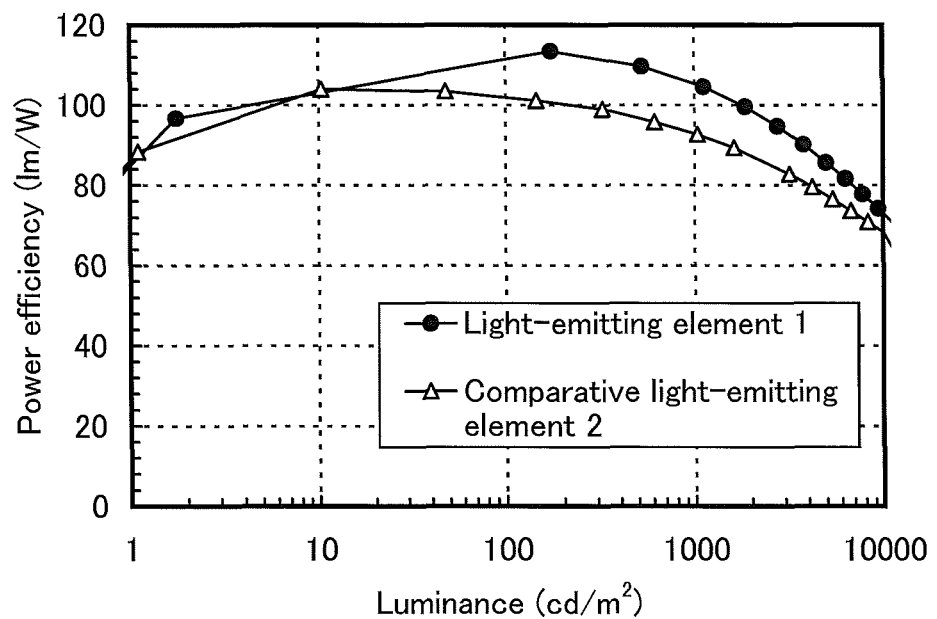
FIG. 19 shows power efficiency versus luminance characteristics of light-emitting elements in Example 1.

FIG. 14 shows luminance versus current density characteristics of the light-emitting element 1 and the comparative light-emitting element 2. In FIG. 14, the horizontal axis represents current density (mA/cm²) and the vertical axis represents luminance (cd/m²). FIG. 15 shows luminance versus voltage characteristics of the light-emitting element 1 and the comparative light-emitting element 2. In FIG. 15, the horizontal axis represents voltage (V) and the vertical axis represents luminance (cd/m²). FIG. 16 shows current efficiency versus luminance characteristics of the light-emitting element 1 and the comparative light-emitting element 2. In FIG. 16, the horizontal axis represents luminance (cd/m²) and the vertical axis represents current efficiency (cd/A). FIG. 17 shows current versus voltage characteristics of the light-emitting element 1 and the comparative light-emitting element 2. In FIG. 17, the horizontal axis represents voltage (V) and the vertical axis represents current (mA). FIG. 18 shows emission spectra of the light-emitting element 1 and the comparative light-emitting element 2. In FIG. 18, the horizontal axis represents wavelength (nm) and the vertical axis represents light emission intensity (arbitrary unit). Note that in FIG. 18, data of the light-emitting elements substantially overlap each other. FIG. 19 shows power efficiency (lm/W) versus luminance characteristics of the light-emitting element 1 and the comparative light-emitting element 2.

As shown in FIG. 19, the power efficiency of the light-emitting element 1 at a luminance of around 1000 cd/m$^2$ is 105 (lm/W) and the power efficiency of the comparative light-emitting element 2 at a luminance of around 1000 cd/m$^2$ is 93 (lm/W). Thus, the power efficiency of the light-emitting element of one embodiment of the present invention is higher than that of the comparative light-emitting element 2 by 12 (lm/W).

Further, Table 4 shows the voltage (V), current density (mA/cm$^2$), CIE chromaticity coordinates (x, y), current efficiency (cd/A), and external quantum efficiency (%) of each light-emitting element at a luminance of around 1000 cd/m$^2$.

TABLE 4

| | Voltage | Current density | CIE chromaticity coordinates | | Luminance | Current efficiency | External quantum efficiency |
|---|---|---|---|---|---|---|---|
| | (V) | (mA/cm$^2$) | x | y | (cd/m$^2$) | (cd/A) | (%) |
| Light-emitting element 1 | 2.6 | 1.3 | 0.43 | 0.56 | 1112 | 87 | 24 |
| Comparative light-emitting element 2 | 2.9 | 1.2 | 0.43 | 0.56 | 1037 | 85 | 24 |

As shown in Table 4, the CIE chromaticity coordinates (x, y) of the light-emitting element 1 at a luminance of 1112 cd/m$^2$ are (0.43, 0.56), and the CIE chromaticity coordinates (x, y) of the comparative light-emitting element 2 at a luminance of 1037 cd/m$^2$ are (0.43, 0.56).

The voltage and current efficiency of the light-emitting element 1 at a luminance of 1112 cd/m$^2$ are 2.6 V and 87 cd/A, respectively. The voltage and current efficiency of the comparative light-emitting element 2 at a luminance of 1037 cd/m$^2$ are 2.9 V and 85 cd/A, respectively.

Thus, the voltage of the light-emitting element 1 which is one embodiment of the present invention can be lower than that of the comparative light-emitting element 2 by 0.3 V, and the current efficiency of the light-emitting element 1 is equivalent to or higher than that of the comparative light-emitting element 2. Moreover, as shown in FIG. 17, the turn-on voltage of the light-emitting element 1 can be lower than that of the comparative light-emitting element 2.

As described above, in the light-emitting element of one embodiment of the present invention, the hole-transport layer contains the fourth organic compound whose HOMO level is lower than or equal to that of the second organic compound with a hole-transport property used in the light-emitting layer, and the fifth organic compound whose HOMO level is higher than that of the second organic compound. With such a structure, the driving voltage of the light-emitting element can be reduced and the current efficiency thereof can be increased.

Note that a PL peak wavelength of the thin film of the first organic compound (2mDBTPDBq-II) used in the light-emitting layer (of the light-emitting element 1) in this example is 426 nm, a PL peak wavelength of the second organic compound (PCBA1BP) is 416 nm, and a PL peak wavelength of a film of a mixture of these organic compounds is 519 nm, which shows that the wavelength is shifted to the longer wavelength side. Thus, the combination of these two kinds of organic compounds forms an exciplex.

As described above, in the light-emitting element 1, the fifth organic compound (PCzPCA1) whose HOMO level is higher than that of the second organic compound (PCBA1BP) which contributes to the formation of an exciplex in the light-emitting layer is added to the hole-transport layer; thus, the turn-on voltage of the light-emitting element 1 can be lower than that of the comparative light-emitting element 2 to which the fifth organic compound is not added.

Note that when PCzPCA1 used instead of PCBA1BP is added as the second organic compound to the light-emitting layer, turn-on voltage can be reduced as in the case of the light-emitting element 1. However, PCzPCA1 has a HOMO level which is higher than that of PCBA1BP; thus, an emission wavelength of an exciplex formed by the first organic compound (2mDBTPDBq-II) and PCzPCA1 is 571 nm, which is located on the longer wavelength side than in the case of using PCBA1BP (519 nm). Thus, in the case of using a green phosphorescent material in the light-emitting layer as in this example, the green phosphorescent material is not easily excited, which leads to a reduction in emission efficiency (external quantum efficiency). In contract, the present invention (the light-emitting element 1) does not have such a problem. In other words, the structure of one embodiment of the present invention is particularly effective in reducing voltage of a light-emitting element emitting green or blue light in which the energy gap is large (i.e., turn-on voltage is high in principle), without reducing emission efficiency.

Reference Example 1

A synthesis example of (acetylacetonato)bis(6-tert-butyl-4-phenylpyrimidinato)iridium(III) (abbreviation: [Ir(tBuppm)$_2$(acac)]) used in the above example will be specifically described. A structure of [Ir(tBuppm)$_2$(acac)] is shown below.

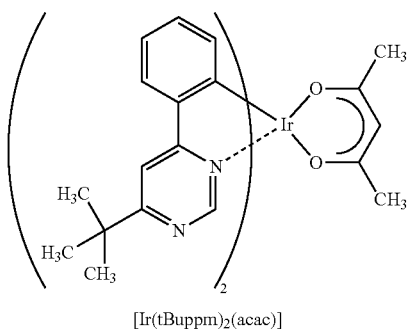

[Ir(tBuppm)₂(acac)]

Step 1 Method of Synthesizing 4-tert-Butyl-6-phenylpyrimidine (abbreviation: HtBuppm)

First, in a recovery flask equipped with a reflux pipe were put 22.5 g of 4,4-dimethyl-1-phenylpentane-1,3-dione and 50 g of formamide, and the air in the flask was replaced with nitrogen. This reaction container was heated, so that the reacted solution was refluxed for 5 hours. After that, this solution was poured into an aqueous sodium hydroxide solution, and an organic layer was extracted with dichloromethane. The obtained organic layer was washed with water and saturated saline, and dried with magnesium sulfate. The solution which had been dried was filtered. The solvent of this solution was distilled off, and then the obtained residue was purified by silica gel column chromatography using hexane and ethyl acetate as a developing solvent in a volume ratio of 10:1, so that a pyrimidine derivative HtBuppm (colorless oily substance, yield of 14%) was obtained. The synthesis scheme of Step 1 is shown in (a-1) given below.

(a-1)

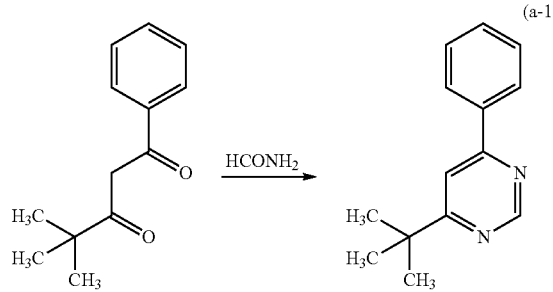

Step 2 Method of Synthesizing Di-μ-chloro-bis-[bis(6-tert-butyl-4-phenylpyrimidinato)iridium(III)] (abbreviation: [Ir(tBuppm)₂Cl]₂)

Next, in a recovery flask equipped with a reflux pipe were put 15 mL of 2-ethoxyethanol, 5 mL of water, 1.49 g of HtBuppm obtained in Step 1, and 1.04 g of iridium chloride hydrate (IrCl₃×H₂O), and the air in the flask was replaced with argon. After that, irradiation with microwaves (2.45 GHz, 100 W) was performed for 1 hour to cause a reaction. The solvent was distilled off, and then the obtained residue was suction-filtered and washed with ethanol to give a dinuclear complex [Ir(tBuppm)₂Cl]₂ (yellow green powder, yield of 73%). A synthesis scheme of Step 2 is shown in (a-2) given below.

(a-2)

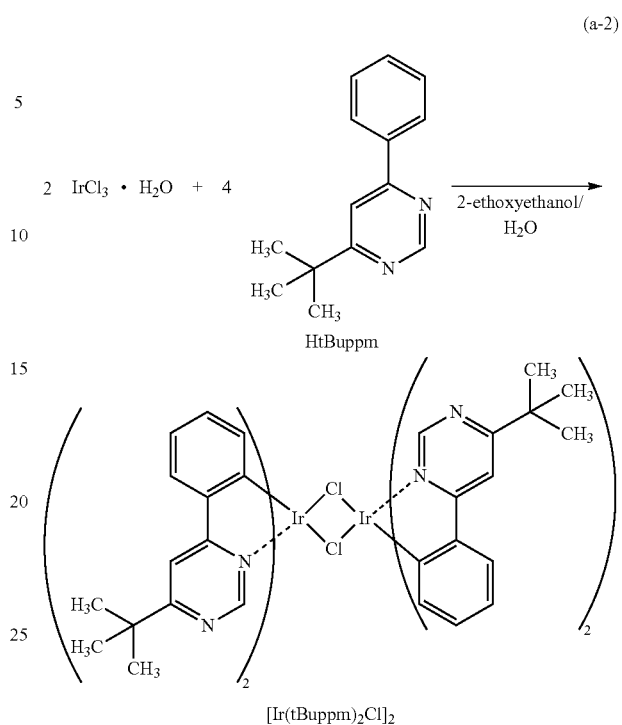

[Ir(tBuppm)₂Cl]₂

Step 3 Method of Synthesizing (Acetylacetonato)bis(6-tert-butyl-4-phenylpyrimidinato)iridium(III) (abbreviation: [Ir(tBuppm)₂(acac)])

Further, in a recovery flask equipped with a reflux pipe were put 40 mL of 2-ethoxyethanol, 1.61 g of the dinuclear complex [Ir(tBuppm)₂Cl]₂ obtained in Step 2, 0.36 g of acetylacetone, and 1.27 g of sodium carbonate, and the air in the flask was replaced with argon. Then, irradiation with microwaves (2.45 GHz, 100 W) was performed for 1 hour to cause a reaction. The solvent was distilled off, and the obtained residue was suction-filtered with ethanol and washed with water and ethanol. This solid was dissolved in dichloromethane, and the mixture was filtered through a filter aid in which Celite (produced by Wako Pure Chemical Industries, Ltd., Catalog No. 531-16855), alumina, and Celite were stacked in this order. The solvent was distilled off, and the obtained solid was recrystallized with a mixed solvent of dichloromethane and hexane, so that the objective substance was obtained as yellow powder (yield of 68%). A synthesis scheme of Step 3 is shown in (a-3) given below.

(a-3)

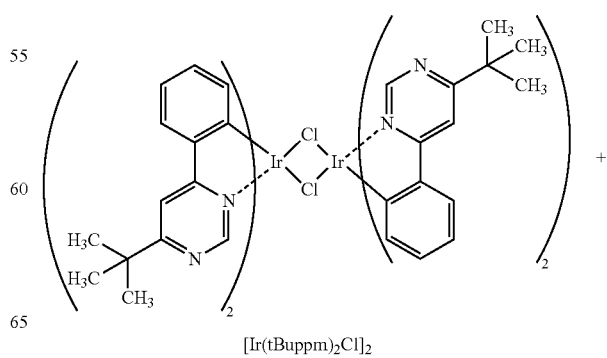

[Ir(tBuppm)₂Cl]₂

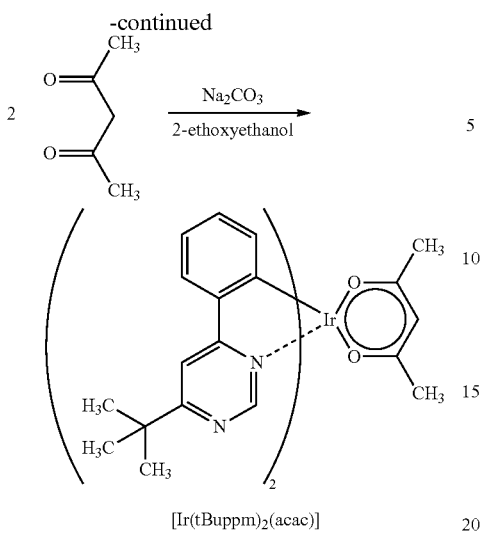

[Ir(tBuppm)₂(acac)]

Note that the compound obtained by the above synthesis method was measured by a nuclear magnetic resonance ($^1$H-NMR) method. These measurement results show that [Ir(tBuppm)₂(acac)] (abbreviation) was obtained.

$^1$H-NMR data of the obtained substance are as follows:
$^1$H-NMR. $\delta$ (CDCl$_3$): 1.50 (s, 18H), 1.79 (s, 6H), 5.26 (s, 1H), 6.33 (d, 2H), 6.77 (t, 2H), 6.85 (t, 2H), 7.70 (d, 2H), 7.76 (s, 2H), 9.02 (s, 2H).

Reference Example 2

$T_1$ levels of 2mDBTPDBq-II (abbreviation), PCBA1BP (abbreviation), and BPAFLP (abbreviation), which were used in the light-emitting elements in the above examples, were measured. Note that the $T_1$ level was measured in such a manner that phosphorescent emission of each substance was measured and a phosphorescence emission wavelength was converted into electron volt. In the measurement, each substance was irradiated with excitation light with a wavelength of 325 nm and the measurement temperature was 10 K. Note that in measuring an energy level, calculation from an absorption wavelength is more accurate than calculation from an emission wavelength. However, here, absorption of each of the $T_1$ levels was extremely low and difficult to measure; thus, each of the $T_1$ levels was measured by measuring a peak wavelength located on the shortest wavelength side in a phosphorescence spectrum. For that reason, a few errors may be included in the measured values.

Figure 20:
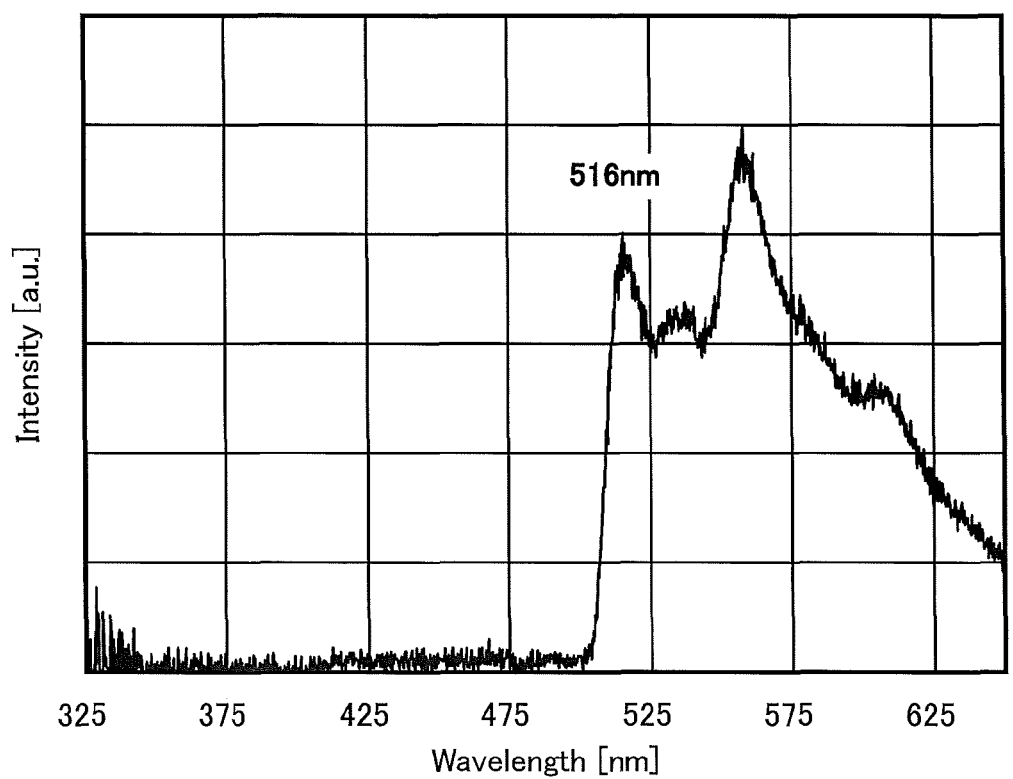
FIG. 20 shows a phosphorescence spectrum of 2mDBTP-DBq-II (abbreviation).
Figure 21:
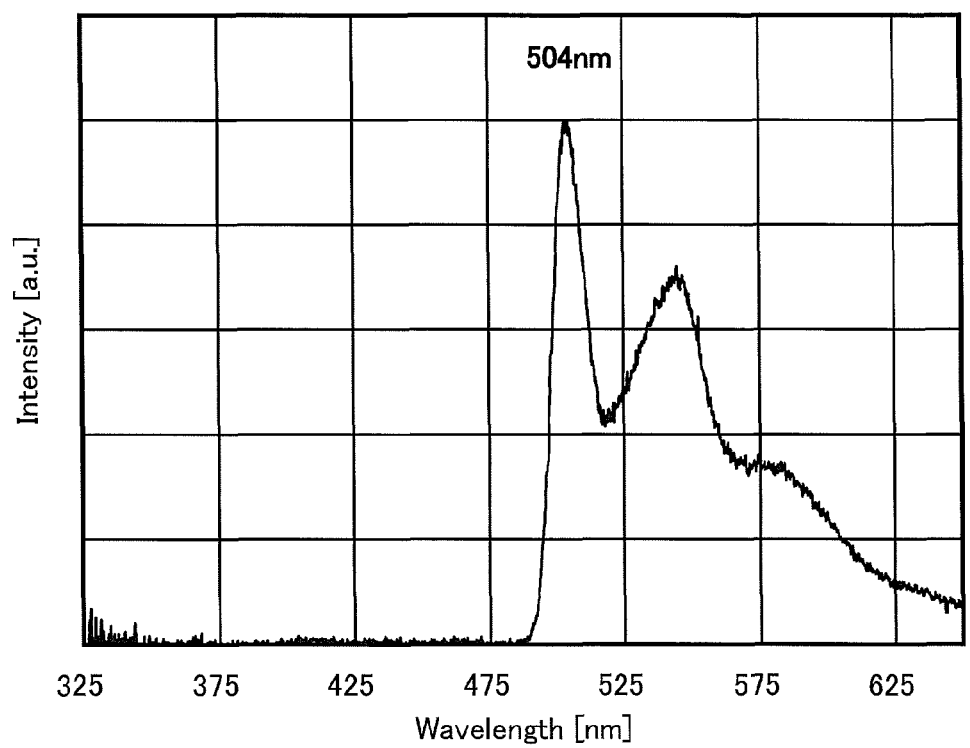
FIG. 21 shows a phosphorescence spectrum of PCBA1BP (abbreviation).
Figure 22:
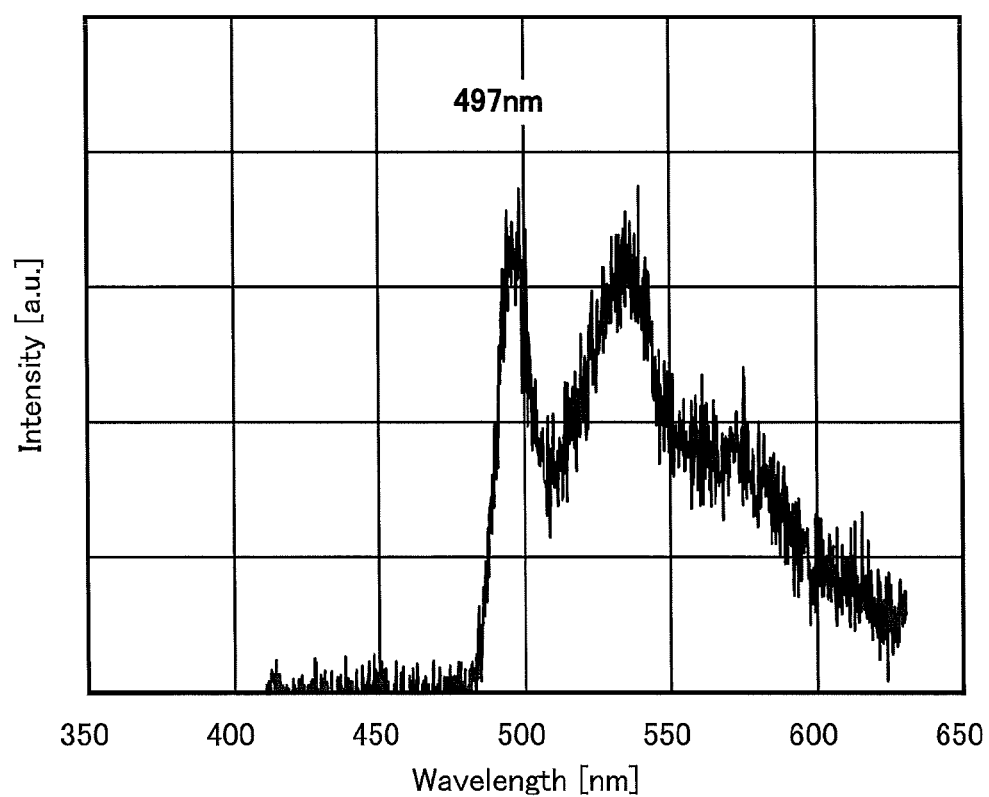
FIG. 22 shows a phosphorescence spectrum of BPAFLP (abbreviation).

FIG. 20, FIG. 21, and FIG. 22 show measured phosphorescence of 2mDBTPDBq-II (abbreviation), measured phosphorescence of PCBA1BP (abbreviation), and measured phosphorescence of BPAFLP (abbreviation), respectively. Table 5 shows the measurement results. As apparent from these results, the $T_1$ level of BPAFLP (abbreviation) which was used in the hole-transport layer and corresponds to the fourth organic compound is higher than those of 2mDBTPDBq-II (abbreviation) used as the first organic compound in the above example and PCBA1BP (abbreviation) used as the second organic compound in the above example.

TABLE 5

| Name of compound | Phosphorescence emission wavelength (nm) | $T_1$ level (eV) |
|---|---|---|
| 2mDBTPDBq-II (abbreviation) | 516 | 2.40 |
| PCBA1BP (abbreviation) | 504 | 2.46 |
| BPAFLP (abbreviation) | 497 | 2.49 |

REFERENCE NUMERALS

100: substrate, 101: first electrode, 103: second electrode, 111: hole-injection layer, 112: hole-transport layer, 112a: hole-transport layer, 112b: hole-transport layer, 112c: hole-transport layer, 113: light-emitting layer, 114: electron-transport layer, 115: electron-injection layer, 120, first organic compound, 122: second organic compound, 124: third organic compound, 126: fourth organic compound, 128: fifth organic compound, 301: first electrode, 303: second electrode, 311: first light-emitting layer, 312: second light-emitting layer, 313: charge generation layer, 450R: first light-emitting element, 450G: second light-emitting element, 450B: third light-emitting element, 451: reflective electrode, 452: semi-transmissive and semi-reflective electrode, 453a: first transparent conductive layer, 453b: second transparent conductive layer, 454: light-emitting layer, 454B: first light-emitting layer, 454G: second light-emitting layer, 454R: third light-emitting layer, 455: EL layer, 501: element substrate, 502: pixel portion, 503: driver circuit portion, 504: driver circuit portion, 505: sealant, 506: sealing substrate, 507: wiring, 508: FPC, 509: n-channel TFT, 510: p-channel TFT, 511: switching TFT, 512: current control TFT, 513: first electrode, 514: insulator, 515: EL layer, 516: second electrode, 517: light-emitting element, 518: space, 611: housing, 612: support, 613: display portion, 614: speaker portion, 615: video input terminal, 621: main body, 622: housing, 623: display portion, 624: keyboard, 625: external connection port, 626: pointing device, 631: main body, 632: housing, 633: display portion, 634: audio input portion, 635: audio output portion, 636: operation key, 637: external connection port, 638: antenna, 641: main body, 642: display portion, 643: housing, 644: external connection port, 645: remote control receiving portion, 646: image receiving portion, 647: battery, 648: audio input portion, 649: operation key, 650: eyepiece portion, 701: housing, 702: liquid crystal panel, 703: backlight, 704: housing, 705: driver IC, 706: terminal, 801: housing, 802: light source, 901: lighting device, 902: television set, 1100: substrate, 1101: first electrode, 1103: second electrode, 1111: hole-injection layer, 1112: hole-transport layer, 1113a: first light-emitting layer, 1113b: second light-emitting layer, 1114a: first electron-transport layer, 1114b: second electron-transport layer, 1115: electron-injection layer, 5000: portable terminal, 5001: housing, 5003: display portion, 5005: power source button, 5007: front camera, 5009: rear camera, 5011: external connection terminal, 5013: external connection terminal, 5015: icon, 6000: portable terminal, 6001: housing, 6003: housing, 6005: hinge portion, 6007: display portion, 6009: display portion, 6011: power source button, 6013: camera, 6015: camera, 6017: text icon, 6019: icon, and 6021: keyboard.

This application is based on Japanese Patent Application serial no. 2012-096887 filed with the Japan Patent Office on Apr. 20, 2012 the entire contents of which are hereby incorporated by reference.

The invention claimed is:

1. A light-emitting element comprising:
 a hole-transport layer; and
 a light-emitting layer over the hole-transport layer,
 wherein the light-emitting layer includes a first organic compound having an electron-transport property, a second organic compound having a hole-transport property, and a third organic compound converting triplet excitation energy into light emission,
 wherein a combination of the first organic compound and the second organic compound forms an exciplex,
 wherein the hole-transport layer includes a fourth organic compound and a fifth organic compound,
 wherein a HOMO level of the fourth organic compound is lower than or equal to a HOMO level of the second organic compound, and
 wherein a HOMO level of the fifth organic compound is higher than the HOMO level of the second organic compound.

2. The light-emitting element according to claim 1, wherein a $T_1$ level of the fourth organic compound is higher than a $T_1$ level of the first organic compound.

3. The light-emitting element according to claim 1, wherein a $T_1$ level of the fourth organic compound is higher than a $T_1$ level of the second organic compound.

4. The light-emitting element according to claim 1,
 wherein the first organic compound is a π-electron deficient heteroaromatic compound,
 wherein the second organic compound, the fourth organic compound, and the fifth organic compound are π-electron rich heteroaromatic compounds or aromatic amine compounds, and
 wherein the third organic compound is a phosphorescent compound.

5. A light-emitting device comprising the light-emitting element according to claim 1.

6. An electronic appliance comprising the light-emitting device according to claim 5.

7. A lighting device comprising the light-emitting device according to claim 5.

8. A light-emitting element comprising:
 a hole-injection layer;
 a hole-transport layer over the hole-injection layer;
 a light-emitting layer over the hole-transport layer;
 an electron-transport layer over the light-emitting layer; and
 an electron-injection layer over the electron-transport layer,
 wherein the light-emitting layer includes a first organic compound having an electron-transport property, a second organic compound having a hole-transport property, and a third organic compound converting triplet excitation energy into light emission,
 wherein a combination of the first organic compound and the second organic compound forms an exciplex,
 wherein the hole-transport layer includes a fourth organic compound and a fifth organic compound,
 wherein a HOMO level of the fourth organic compound is lower than or equal to a HOMO level of the second organic compound, and
 wherein a HOMO level of the fifth organic compound is higher than the HOMO level of the second organic compound.

9. The light-emitting element according to claim 8, wherein a $T_1$ level of the fourth organic compound is higher than a $T_1$ level of the first organic compound.

10. The light-emitting element according to claim 8, wherein a $T_1$ level of the fourth organic compound is higher than a $T_1$ level of the second organic compound.

11. The light-emitting element according to claim 8,
 wherein the first organic compound is a π-electron deficient heteroaromatic compound,
 wherein the second organic compound, the fourth organic compound, and the fifth organic compound are π-electron rich heteroaromatic compounds or aromatic amine compounds, and
 wherein the third organic compound is a phosphorescent compound.

12. A light-emitting device comprising the light-emitting element according to claim 8.

13. An electronic appliance comprising the light-emitting device according to claim 12.

14. A lighting device comprising the light-emitting device according to claim 12.

* * * * *